United States Patent
Hyung

(10) Patent No.: US 11,618,851 B2
(45) Date of Patent: Apr. 4, 2023

(54) DISPERSANT, LIGHT EMITTING FILM, LIGHT EMITTING DIODE AND LIGHT EMITTING DEVICE INCLUDING THE DISPERSANT

(71) Applicant: LG DISPLAY CO., LTD., Seoul (KR)

(72) Inventor: Min-Surk Hyung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 274 days.

(21) Appl. No.: 17/023,852

(22) Filed: Sep. 17, 2020

(65) Prior Publication Data

US 2021/0095193 A1 Apr. 1, 2021

(30) Foreign Application Priority Data

Oct. 1, 2019 (KR) .......................... 10-2019-0121691

(51) Int. Cl.
*C09K 11/02* (2006.01)
*H01L 33/06* (2010.01)
(Continued)

(52) U.S. Cl.
CPC ........ *C09K 11/025* (2013.01); *C08G 18/1808* (2013.01); *C08G 18/2063* (2013.01); *C08G 18/3206* (2013.01); *C08G 18/4862* (2013.01); *C08G 18/6674* (2013.01); *C08G 18/73* (2013.01); *C09K 11/0883* (2013.01); *C09K 11/883* (2013.01); *H01L 25/0753* (2013.01); *H01L 27/322* (2013.01); *H01L 27/3244* (2013.01); *H01L 33/06* (2013.01);
(Continued)

(58) Field of Classification Search
None
See application file for complete search history.

(56) References Cited

U.S. PATENT DOCUMENTS 8,338,558 B2 12/2012 Richards et al.
2008/0227945 A1 9/2008 Richards et al.

FOREIGN PATENT DOCUMENTS

KR 10-2008-0022095 A 3/2008

*Primary Examiner* — Jeffrey D Washville
(74) *Attorney, Agent, or Firm* — Morgan, Lewis & Bockius LLP

(57) ABSTRACT

The present disclosure relates to a dispersant having the following structure of Chemical Formula 1, a light emitting film in which the dispersant is adsorbed on a surface of an inorganic luminescent particle, and a light emitting diode and a light emitting device in which the light emitting film is applied into an emitting material layer and/or a color conversion film. The dispersant enables the inorganic luminescent particle to have excellent dispersion property and optical properties, and thus the light emitting diode and the light emitting device can its luminous efficiency and luminous lifetime.

13 Claims, 11 Drawing Sheets

[Chemical Formula 1]

(51) Int. Cl.
- *H01L 33/50* (2010.01)
- *H01L 33/56* (2010.01)
- *H01L 27/32* (2006.01)
- *H01L 51/50* (2006.01)
- *C08G 18/48* (2006.01)
- *C08G 18/32* (2006.01)
- *C08G 18/66* (2006.01)
- *C08G 18/73* (2006.01)
- *C08G 18/20* (2006.01)
- *C08G 18/18* (2006.01)
- *C09K 11/88* (2006.01)
- *C09K 11/08* (2006.01)
- *H01L 25/075* (2006.01)
- *H01L 51/00* (2006.01)
- *B82Y 40/00* (2011.01)
- *F21V 8/00* (2006.01)
- *B82Y 20/00* (2011.01)

(52) U.S. Cl.
CPC ............ *H01L 33/502* (2013.01); *H01L 33/56* (2013.01); *H01L 51/00* (2013.01); *H01L 51/502* (2013.01); *B82Y 20/00* (2013.01); *B82Y 40/00* (2013.01); *G02B 6/0073* (2013.01)

1,1-Heptandiol    1,1-Decandiol    1,1-Hexadecandiol    1,1-Octadecandiol

DISPERSANT, LIGHT EMITTING FILM, LIGHT EMITTING DIODE AND LIGHT EMITTING DEVICE INCLUDING THE DISPERSANT

CROSS-REFERENCE TO RELATED APPLICATIONS

This application claims the benefit under 35 U.S.C. § 119(a) to Republic of Korea Patent Application No. 10-2019-0121691, filed in Republic of Korea on Oct. 1, 2019, the entire contents of which are incorporated herein by reference into the present application.

BACKGROUND

Technical Field

The present disclosure relates to a dispersant, and more particularly, to a dispersant that improves dispersion properties and thermal resistance of an inorganic luminescent particle, a light emitting film, a light emitting diode and a light emitting device including the dispersant.

Discussion of the Related Art

As the information communication technologies and electronics technologies have developed, various flat display devices in place of the conventional CRT have been proposed. Among those flat display devices, a liquid crystal display (LCD) device, an organic light-emitting diode (OLED) display device and a quantum-dot light emitting diode (QLED) display device, each of which can realize thinner and lighter weight compared to the CRT, has been in the spotlight.

Since the liquid crystal panel cannot emit light by itself, the use of an external backlight unit serving as a light source is essential. Compared to the LCD device, each of the OLED and QLED devices can be fabricated with more thinness and light weight. Also, each of the OLED and QLED has advantages in terms of power consumption, and thus has low driving voltages and fast response speed compared to the LCD. In addition, each of the OLED and QLED can be fabricated using simple process, there is an advantage that the production const can be much reduced than the LCD.

The OLED or the QLED comprises a red EML, a green EML and a blue EML for each of a red pixel region, a green pixel region and a blue pixel region, and emits red (R), green (G) and blue (B) lights to implement full-color images. Recently, an OLED or QLED display device having red/green/blue/white structures that forms a light emitting diode emitting white (W) light over the whole pixel region and adopts a color filter layer has been mainly used.

Since considerable amount of white light emitted from the OLED or the QLED in the conventional OLED or QLED display device is adsorbed in the color filter layer, luminous efficiency is deteriorated. Since the color filter layer that is formed correspondingly to the red, green and blue pixel regions in the OLED and the QLED display devices transmits light with specific wavelengths and absorbs light with other wavelengths, the luminous efficiency is greatly reduced. In addition, a quantum dots as inorganic luminescent particles are vulnerable to oxygen or moisture, and have poor thermal resistance. When manufacturing or using a light emitting display device including the quantum dots, the quantum dots exposed to outside air or moisture deteriorates, and the luminous efficiency and luminous lifetime of the devices deteriorates. Moreover, since the quantum dots has bad dispersion properties for the solvents, there exists a limit to use only specific type solvent when forming the quantum dot film in a solution process.

SUMMARY

Accordingly, embodiments of the present disclosure are directed to a dispersant, and a light-emitting apparatus such as a light-emitting film, a light emitting diode, a light emitting device including the dispersant that substantially obviate one or more of the problems due to limitations and disadvantages of the related art.

An aspect of the present disclosure is to provide a dispersant having excellent dispersion properties and can enhance thermal resistances of a luminescent particle, a light emitting film, a light emitting diode and a light emitting device including the dispersant.

Another aspect of the present disclosure is to provide a dispersant that can improvise luminous efficiency and luminous lifetime of the luminescent particle, a light emitting film, a light emitting diode and a lithe emitting device including the dispersant.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, the present disclosure provides a dispersant having the following Chemical Formula 1:

[Chemical Formula 1]

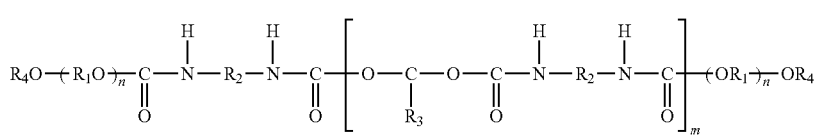

wherein $R_1$ is an unsubstituted or substituted $C_2$-$C_{20}$ alkylene group, an unsubstituted or substituted $C_2$-$C_{20}$ alkyl vinylene group, an unsubstituted or substituted $C_6$-$C_{30}$ arylene group or an unsubstituted or substituted $C_3$-$C_{30}$ hetero arylene group; $R_2$ is an unsubstituted or substituted $C_1$-$C_{20}$ alkylene group, an unsubstituted or substituted $C_5$-$C_{20}$ cyclo alkylene group, an substituted or substituted $C_6$-$C_{20}$ arylene group, a $C_{10}$-$C_{30}$ bicyclo alkylene group or a $C_{12}$-$C_{30}$ biarylene group, wherein each of the $C_{10}$-$C_{30}$ bicyclo alkylene group and the $C_{12}$-$C_{30}$ biarylene group is linked to a $C_1$-$C_5$ alkylene group; $R_3$ is a $C_5$-$C_{20}$ aliphatic hydrocarbon; $R_4$ is protium, deuterium or a $C_1$-$C_{10}$ alkyl group; and each of m and n is independently an integer of 1 to 100.

In another aspect, the present disclosure provides a light emitting film comprises an inorganic luminescent particle and a dispersant having the structure of Chemical Formula 1 and adsorbed on a surface of the inorganic luminescent particle.

In still another aspect, the present disclosure provides an inorganic light emitting diode (LED) that comprises a first electrode, a second electrode facing the first electrode, and an emitting material layer disposed between the first and second electrodes, wherein the emitting material layer comprises an inorganic luminescent particle and the dispersant adsorbed on a surface of the inorganic luminescent particle.

In further still another aspect, the present disclosure provides an inorganic light emitting device comprises a substrate and an inorganic emitting diode as defined above.

In further still another aspect, the present disclosure provides a light emitting device comprises a substrate, a light emitting diode over the substrate and a color conversion layer disposed between the substrate and the light emitting diode or over the light emitting diode, wherein the color conversion layer converts a light emitted from the light emitting diode to other colors, and wherein the color conversion layer comprises an inorganic luminescent particle and the dispersant adsorbed on a surface of the inorganic luminescent particle.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate implementations of the disclosure and together with the description serve to explain principles of the disclosure.

DETAILED DESCRIPTION

Figure 1:
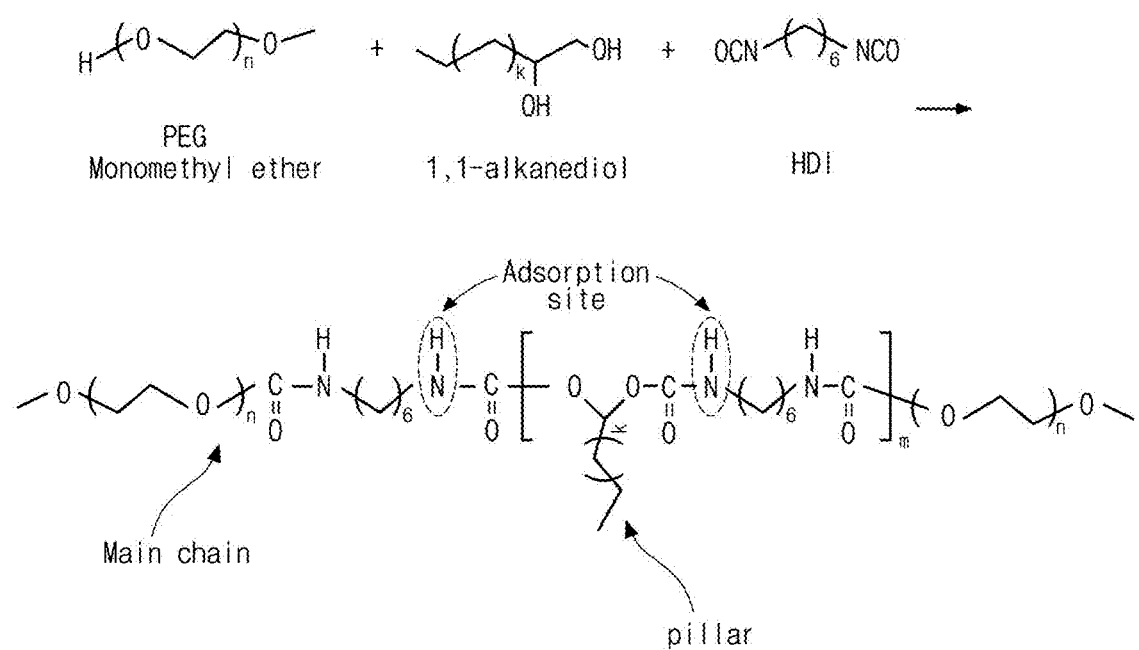
FIG. 1 is a schematic diagram illustrating synthesis scheme of a dispersant in one exemplary aspect of the present disclosure and illustrates polyethylene glycol (PEG) as an alcohol precursor and 1,6-hexamethylene diisocyanate (HDI) as an isocyanate precursor.

Reference and discussion will now be made below in detail to aspects, embodiments and examples of the disclosure, some examples of which are illustrated in the accompanying drawings.

[Dispersant and Inorganic Luminescent Particle]

An inorganic luminescent particle such as a quantum dot (QD) or a quantum rod (QR) has been applied into a solution process such as an inkjet printing process as well as a photo-resist (PR) process. To this end, it is important to select a material suitable for the printing process or to apply a material having a high refractive index such as $TiO_2$ to the inorganic luminescent particles in order to improve the transmittance and enhance the recycle effect for excitation light emitted from the particles. Particularly, when the inorganic luminescent particles are dispersed in the ink-type composition, there is a high interest in thermally curable type materials and photo-curable materials such as UV-curable materials. Accordingly, it is necessary to develop materials suitable for the ink-type composition in order to optimize the performances of the inorganic luminescent particles.

The thermally curable ink generally comprises the inorganic luminescent particles, a polymer, a high refractive index material and a solvent, and the contents of the inorganic luminescent particles in the ink is typically about 30 wt %. A thermally curable film containing the inorganic luminescent particles usually has a thickness of 6 um or more, and there is a problem in that the luminous efficiency of the inorganic luminescent particles is lowered by a plastic working process. On the other hand, the photo-curable ink cured by light such as UV includes the inorganic luminescent particles, a polymer and a high refractive index material. The photo-curable film should have a thickness of at least 10 um, but the contents of the inorganic luminescent particles are low since there is no solvent, which limits the luminous efficiency.

Also, the conventional polyurethane-based dispersant applied as an ink-type lacks solvent-compatible sites. Therefore, the convention polyurethane-based dispersant can be dispersed only in a non-polar solvent such as toluene (refractive index n is 1.4965, dielectric constant ε is 2.38), hexane (n is 1.375, ε is 1.89), but cannot dispersed in a polar solvent such as propylene glycol monomethyl ether (PGMEA; n is 1.40, ε is 8.3). Accordingly, when a solution process such as an ink jet printing process is applied to form a thin film of inorganic luminescent particles, a type of solvent that can be used is limited.

In addition, since the conventional polyurethane-based dispersant consists of a linear backbone or main chain, it is difficult to prevent the adjacent inorganic luminescent particles from agglomerating or aggregating with each other even if the conventional polyurethane-based dispersant adsorbs to the inorganic luminescent particles. In this case, while the donor inorganic luminescent particles are disposed close to predetermined distance from adjacent acceptor inorganic luminescent particles, light emitted from the donor inorganic luminescent particles is absorbed by the acceptor inorganic luminescent particles. Accordingly, the light energy emitted from the donor inorganic luminescent particles does not induce luminescence of the donor inorganic luminescent particles, but excites adjacent acceptor inorganic luminescent particles to induce FRET (Forster/Fluorescence Resonance Energy Transfer) of the acceptor inorganic luminescent particles, and therefore the light energy is lost. The inorganic luminescent particles have deteriorated quantum yield (QY) due to such self-quenching mechanism. Moreover, when the inorganic luminescent particles such as QD are exposed continuously to high temperature, the ligand bound to the surface on the inorganic luminescent particles is detached or separated from the particles, or the core/shell of the particles are oxidized, resulting in a rapidly deteriorated luminous properties of the particles.

In one aspect, the present disclosure relates to a polyurethane-based dispersant having a Host-Guest molecular conformation that can be utilized in a dispersion composition such as a thermally curable ink including inorganic luminescent particles. A pillar structure introduced as a guest within the dispersant enables the inorganic luminescent particles to be dispersed in a polar solvent as well as a non-polar solvent. In addition, since the pillar structure having a predetermined length can prevent the adjacently disposed inorganic luminescent particles from agglomerating, quantum efficiency deterioration due to FREM between adjacently disposed inorganic luminescent particles can be prevented.

Moreover, as the dispersant having the pillar structure encapsulates the inorganic luminescent particles, the inorganic luminescent particles exposed to high temperature can improve its thermal resistance. In other words, it is possible to disperse the inorganic luminescent particles in a polar solvent, to prevent the quantum efficiency of the particles from deteriorating, and to secure the thermal resistance which is required during the film formation process using the ink-type composition having the particles, by dispersing the inorganic luminescent particles in the dispersant of the present disclosure. The dispersant of the present disclosure has the following structure of Chemical Formula 1:

In Chemical Formula 1, $R_1$ is an unsubstituted or substituted $C_2$-$C_{20}$ alkylene group, an unsubstituted or substituted $C_2$-$C_{20}$ alkyl vinylene group, an unsubstituted or substituted $C_6$-$C_{30}$ arylene group or an unsubstituted or substituted $C_3$-$C_{30}$ hetero arylene group; $R_2$ is an unsubstituted or substituted $C_1$-$C_{20}$ alkylene group, an unsubstituted or substituted $C_5$-$C_{20}$ cyclo alkylene group, an substituted or substituted $C_6$-$C_{20}$ arylene group, a $C_{10}$-$C_{30}$ bicyclo alkylene group or a $C_{12}$-$C_{30}$ biarylene group, wherein each of the $C_{10}$-$C_{30}$ bicyclo alkylene group and the $C_{12}$-$C_{30}$ biarylene group is linked to a $C_1$-$C_5$ alkylene group; $R_3$ is a $C_5$-$C_{20}$ aliphatic hydrocarbon; $R_4$ is protium, deuterium or a $C_1$-$C_{10}$ alkyl group; and each of m and n is independently an integer of 1 to 100.

As used herein, the term "unsubstituted" means that hydrogen is linked, and in this case, hydrogen comprises protium, deuterium and tritium.

As used the term "substituted" herein, the substitution group comprises, but is not limited to, unsubstituted or halogen-substituted $C_1$-$C_{20}$ alkyl, unsubstituted or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term "hetero" in such as "a hetero aromatic ring", "a hetero cycloalkyene group", "a hetero arylene group", "a hetero aryl alkylene group", "a hetero aryl oxylene group", "a hetero cycloalkyl group", "a hetero aryl group", "a hetero aryl alkyl group", "a hetero aryloxyl group", "a hetero aryl amino group" means that at least one carbon atom, for example 1-5 carbons atoms, constituting an aromatic ring or an alicyclic ring is substituted at least one hetero atom selected from the group consisting of N, O, S, P and combination thereof.

In one exemplary aspect, each of the $C_2$-$C_{20}$ alkylene group, the $C_2$-$C_{20}$ alkyl vinylene group, the $C_6$-$C_{30}$ arylene group and the $C_3$-$C_{30}$ hetero arylene group in $R_1$ may be independently unsubstituted or substituted with at least one of a $C_1$-$C_{20}$ alkyl amino group, an ether (—O) group, an ester group (—COO—), a carbonate group (—OCCO—), a $C_3$-$C_{20}$ alkyl (meth) acrylate group and a $C_3$-$C_{20}$ alkyl (meth) acrylic acid group. In addition, each of the $C_5$-$C_{20}$ cyclo alkylene group and the $C_6$-$C_{20}$ arylene group in $R_2$ may be unsubstituted or substituted with a $C_1$-$C_{10}$ alkyl group. As used herein, each of the term (meth) acrylate refers to acrylate and methacrylate, and the term (meth) acrylic acid refers to acrylic acid and methacrylic acid as indicated otherwise.

As indicated in Chemical Formula 1, the polyurethane-based dispersant can disperse better the inorganic luminescent particles compared to acryl-based or polyester-based dispersants. Particularly, the polyurethane-based dispersant can solve the issues of decreasing of the quantum yield (QY)

[Chemical Formula 1]

Figure 2:
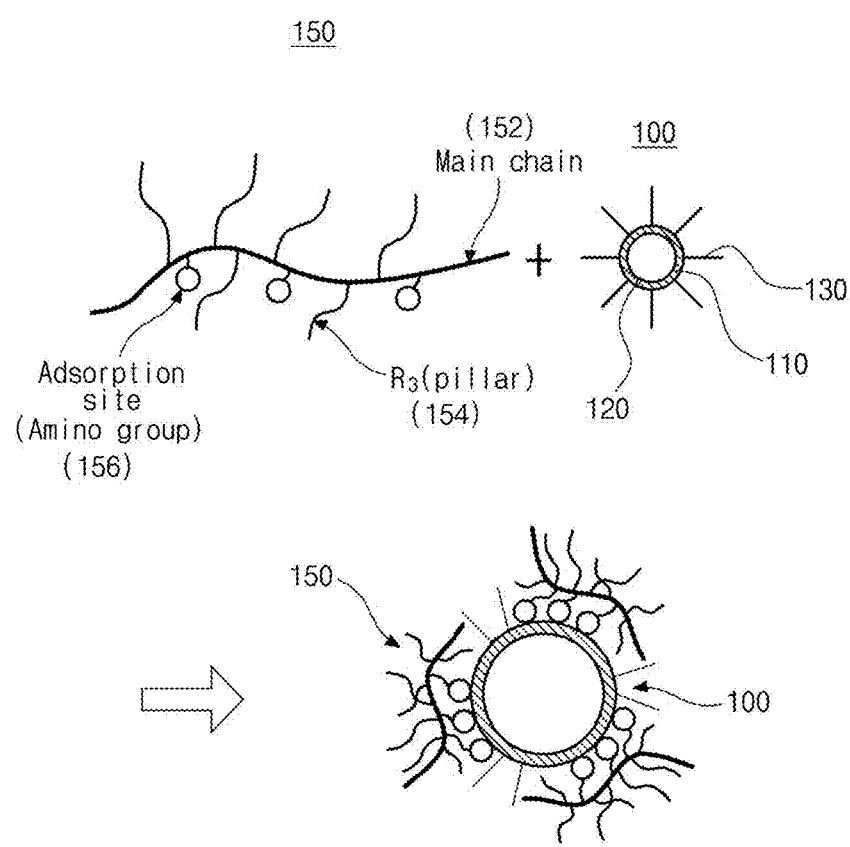
FIG. 2 is a schematic diagram illustrating a mechanism of dispersing an inorganic luminescent particle a dispersant in accordance of the present disclosure.

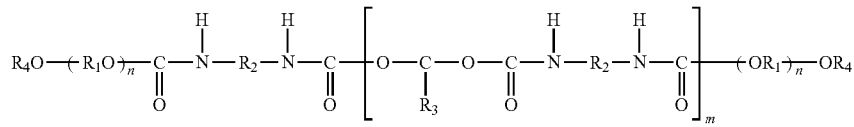

and external quantum efficiency (EQE) of the inorganic luminescent particles involved in the high-temperature heat treatment process before and after the film forming process using the ink-type composition containing the particle. FIG. 1 is a schematic diagram illustrating synthesis scheme of a dispersant in one exemplary aspect of the present disclosure and illustrates polyethylene glycol (PEG) as an alcohol precursor and 1,6-hexamethylene diisocyanate (HDI) as an isocyanate precursor. FIG. 2 is a schematic diagram illustrating a mechanism of dispersing an inorganic luminescent particle a dispersant in accordance of the present disclosure.

As illustrated in FIG. 1, an alkanediol as a guest is added to a host that is an alcohol precursor and an ioscyanate precursor constituting the polyurethane backbone or main chain. Accordingly, a host-guest type polyurethane-based dispersant having an extended pillar structure derived from the guest alkanediol as a side chain of the polyurethane main chain is synthesized.

The pillar structure constituting the side chain of the polyurethane main chain does not act as a branching or bridge for extending the main chain, but as a threshold or a barrier to improve or enhance the dispersion properties of the inorganic luminescent particles and to prevent the particles from agglomerating. To this end, the alkanediol added to form the pillar structure may be 1,1-alkanediol, and the pillar structure as the side chain may be introduced into the polyurethane main chain using a host-guest reaction.

When 1,1-alkanedio is added in synthesizing the dispersant, the hydrogen atom of the hydroxyl group linked to the $1^{st}$ position of the 1,1-alkandiol is reacted with the nitrogen atom of the isocyanate group forming the urethane bond, and the oxygen atom of 1,1-alkanediol is bonded to the carbonyl group to form the extended pillar structure as the side chain of the polyurethane main chain. In this case, the aliphatic chain, which forms the pillar structure inserted in the linear polyurethane main chain, has an anti-conformational structure.

As illustrated in FIGS. 1 and 2, the extended pillar structure 154 in the dispersant 150 does not cover an adjacently positioned amino group 154 that can be adsorbed or anchored on a surface of the inorganic luminescent particles, in the polyurethane main chain 152. In one exemplary aspect, $R_3$ in Chemical Formula 1, which corresponds to the pillar structure 154, may comprise, but is not limited to, a $C_5$-$C_{20}$ aliphatic hydrocarbon, for example, a $C_5$-$C_{18}$ alkyl group, preferably a $C_7$-$C_{18}$ linear alkyl group (In FIG. 1, the number of k is 4-17, preferably 6-17).

If the number of the carbon atom in $R_3$ is less than five, the length of the pillar structure 154 adsorbed on the surface of the inorganic luminescent particle 150 is too short to prevent the agglomeration of the inorganic luminescent particle 150. In addition, since the length of the pillar structure 150 is not sufficient to protect the inorganic luminescent particle 150 from external influences such as heat, oxygen and moisture, the thermal resistance and dispersion properties of the inorganic luminescent particle 150 may be deteriorated.

On the contrary, if the number of the carbon atom in $R_3$ exceeds 20, a defect may occur in the aliphatic hydrocarbon, and the pillar structure 154 may from a Gauche conformation or a twisted oriented structure, kink conformation, not an anti-conformation, by the external influence, i.e. external forces, therefore does not form a stable pillar structure 154. When the aliphatic hydrocarbon constituting the pillar structure 154 forms the Gauche conformation or the kink conformation, the bonding angle between the pillar structure 154 and polyurethane main chain 152 decreases, and the pillar structure 154 may cover the adjacently positioned amino group 156. Accordingly, the dispersion properties and the thermal resistance of the inorganic luminescent particle 100 may be deteriorated as the pillar structure 154 covers a space at which the dispersant 150 adsorbs to the inorganic luminescent particle 100.

For example, when 1,2-alkanediol, 1,3-alkanediol and/or 1,ω-diol are added as guests, a geometrical resistance between the polyurethane main chain 152, which prefers a linear structure with regard to an orientation of the polyurethane, and the aliphatic hydrocarbon constituting the pillar structure 154 is occurred. In this case, strain occurs between those chains, and the resulting strain causes stress in the whole dispersant molecular structure. The stress within the dispersant molecule 150 shifts from the polyurethane main chain 152 to the pillar structure 154, and the aliphatic hydrocarbon chain constituting the pillar structure 154 forms Gauche conformation or kink conformation, not anti-conformation.

The dispersant 150 of the present disclosure has the sable pillar structure 154 in which an aliphatic side chain derived from 1,1-diol is elongated without extending the urethane backbone. The stable pillar structure 154 acts as a site compatible with an organic solvent, thus the inorganic luminescent particle 100 dispersed in the dispersant 150 can be stably dispersed in a polar solvent as well as a non-polar solvent.

Since the long-extending aliphatic side chain of the polyurethane does not cover the site absorbed on the surface of the inorganic luminescent particle 100, it can stably absorb and anchor on the surface of the inorganic luminescent particle. The pillar structure 154 induce a sterical hindrance effect, thus the inorganic luminescent particle 100 is spaced apart from each other at least the length of the pillar structure 154. Since the distance between adjacently dispersed inorganic luminescent particles 100 cannot be too close due to the long elongated aliphatic side chain, it is possible to minimize FRET phenomenon in which energy transfer between adjacently dispersed inorganic luminescent particles 100. Also, the inorganic luminescent particles 100 does not show any decrease in luminous efficiency due to the FRET. As the dispersant 150 adheres strongly on the surface of the inorganic luminescent particle 100, it is possible to minimize contact external oxygen or moisture with the inorganic luminescent particles. In addition, as the dispersant 150 encapsulates the inorganic luminescent particle 100, the dispersant 150 protects the inorganic luminescent particle 100 in high temperature environment, so that the inorganic luminescent particle 100 can improve its thermal resistance property. By dispersing the inorganic luminescent particle 100 in the dispersant 150, the inorganic luminescent particle can maintain its luminous efficiency and luminous lifetime even when the inorganic luminescent particles 100 are exposed to external air or moisture or in the high temperature environment. Therefore, the dispersant may be applied to a light emitting film, a LED package, a color conversion film and a light emitting diode each of which requires excellent luminescent properties.

The polyurethane main chain 152 may be derived from an alcohol precursor and an isocyanate precursor. For example, each of $R_1$ and $R^4$ may be independently derived from an alcohol-based precursor having at least one hydroxyl group. As an example, the alcohol-based precursor may comprise, but is not limited to, polyether-based alcohols based on propylene oxides or ethylene oxides; aliphatic polyester-based alcohols; aromatic polyester-based alcohols; polyether-based alcohols based on tetrahydrofuran (THF);

polycarbonate-based alcohols; acryl-based alcohol; and alkenyl-based alcohols such as polybutadiene.

For example, the polyether-based alcohols may be synthesized through addition reaction of ethylene oxide or propylene oxide and alcohol or amine initiator in the present of an acid or base catalyst. The polyester-based alcohol may be synthesized by a condensation reaction of glycols (ex. ethylene glycol, 1,4-butanediol, 1,6-hexanediol) and an aliphatic or aromatic dicarboxylic acid/anhydride. The acryl-based alcohols may be synthesized by free radical polymerization process that reacting hydroxyethyl (meth) acrylate with other acrylic compounds.

As an example, $R_1$ in Chemical Formula 1 may comprise, but is not limited to, a $C_3$-$C_{10}$ alkylene group unsubstituted or substituted with at least one group selected from a $C_1$-$C_{10}$ alkyl amino group such as an amino methyl group, an amino ethyl group, an amino propyl group and an amino butyl group, an ether group, an ester group, a carbonated group, a $C_3$-$C_{10}$ alkyl (meth) acrylate group such as a methyl (meth) acrylate group and an ethyl (meth) acrylate group, and $C_3$-$C_{30}$ alkyl (meth) acrylic acid group; $C_2$-$C_{10}$ alkyl vinylene group; a $C_6$-$C_{10}$ arylene group unsubstituted or substituted with at least one group selected from a $C_1$-$C_{10}$ alkyl amino group such as an amino methyl group, an amino ethyl group, an amino propyl group and an amino butyl group, an ether group, an ester group, a carbonated group, a $C_3$-$C_{10}$ alkyl (meth) acrylate group such as a methyl (meth) acrylate group and an ethyl (meth) acrylate group, and $C_3$-$C_{30}$ alkyl (meth) acrylic acid group; and $C_3$-$C_{10}$ hetero arylene group unsubstituted or substituted with at least one group selected from a $C_1$-$C_{10}$ alkyl amino group such as an amino methyl group, an amino ethyl group, an amino propyl group and an amino butyl group, an ether group; an ester group, a carbonated group, a $C_3$-$C_{10}$ alkyl (meth) acrylate group such as a methyl (meth) acrylate group and an ethyl (meth) acrylate group, and $C_3$-$C_{30}$ alkyl (meth) acrylic acid group.

In Chemical Formula 1, $R_2$ may be derived from the isocyanate precursor. The isocyanate precursor may comprises, but is not limited to, 1,6-hexamethylene diisocyanate (HDI), 2,2,4-trimethyl hexamethylene diisocyanate (TDMI), isophorone diisocyanate (IPDI), 4,4'-dicyclohexylmethane diisocyanate ($H_{12}$MDI), norbonane diisocyanate (NDI), 2,4'-diphenylmethane diisocyanate, polymethylnephenyl diisocyanate (PMDI), xylylene diisocyanate (XDI), meta-tetramethyl xylylene diisocyanate (TMXDI), hydrogenated xylylene diisocyanate (HXDI), naphthalene-1,5-diisocyante, p-phenylene diisocyanate (PPDI) and 3,3'-dimethylphenyl-4,4'-diisocynanate (DDDI).

As an example, $R_2$ in Chemical Formula 1 may comprise, but is not limited to, a $C_1$-$C_{10}$ alkylene group, an unsubstituted or $C_1$-$C_5$ alkyl substituted $C_5$-$C_{20}$ cyclo alkylene group, an unsubstituted or $C_1$-$C_5$ alkyl substituted $C_6$-$C_{10}$ arylene group, a $C_{10}$-$C_{20}$ bicyclo alkylene group linked to a $C_1$-$C_3$ alkylene group (ex. $C_2$-$C_3$ alkylene group) and a $C_{10}$-$C_{20}$ biarylene group linked to a $C_1$-$C_3$ alkylene group (ex. $C_2$-$C_3$ alkylene group). For Example, $R_2$ in Chemical Formula 1 may be a $C_2$-$C_{10}$ alkylene group, preferably a $C_5$-$C_{10}$ alkylene group.

In one exemplary aspect, the polyurethane-based dispersant having the structure of Chemical Formula 1 may have a weigh average molecular weight ($M_W$), but is not limited to, between about 2,000 and about 50,000, preferably between about 2,000 and about 10,000. When the polyurethane-based dispersant has the weight average molecular weight within the ranges above, it can stably adsorb on the surface of the inorganic luminescent particle 100 and exhibit intended functions.

The inorganic luminescent particle 100 that can be dispersed in the polyurethane-based dispersant 150 may comprise a quantum dot (QD) a quantum rod (QR). As an example, when the inorganic luminescent particle 100 receives primary light emitted from a light source, electrons becomes an excited state from a ground state, and emits photons when falling from the excited state to the ground state, and emits secondary light with different wavelength bands. Alternatively, the inorganic luminescent particle 100 can form excitons excited by charge carriers such as holes and electrons, respectively, generated from two opposite electrodes in the light emitting diode D, D1 (see, FIGS. 8 and 9), and then emit light with predetermined wavelength bands.

Inorganic luminescent particle 100 such as QDs or QRs are inorganic luminescence particle which emits light as unstable charge excitons shifts from the conduction band energy level to the valance band energy level. These inorganic luminescence particles 100 have very large extinction coefficient, high quantum yield among inorganic particles and generates strong fluorescence. In addition, these inorganic luminescence particles 100 emits at different luminescence wavelengths as its sizes, it is possible to emit lights within the whole visible light spectra so as to implement various colors by adjusting sizes of these inorganic luminescence particles 100

In one exemplary aspect, the inorganic luminescent particle 100 may have a single-layered structure. In another exemplary aspect, the inorganic luminescent particle 100 may have a multiple-layered heterologous structure, i.e. a core 110, a shell 120 enclosing the core 110. The inorganic luminescent particle 100 may comprise plural ligands 130 bound to a surface of the shell 120.

Each of the core 110 and the shell 120 may have a single layer or multiple layers, respectively. The reactivity of precursors forming the core 110 and/or shell 120, injection rates of the precursors into a reaction vessel, reaction temperature and kinds of ligand 130 bonded to the outer surface of those inorganic luminescence particles 100 may have affects upon the growth degrees, crystal structures of those inorganic luminescence particles 100. As a result, it is possible to emit lights of various luminescent wavelength ranges, as the energy level bandgap of those inorganic luminescence particles 100 are adjusted.

In one exemplary aspect, inorganic luminescence particles 100 (e.g. QDs and/or QRs) may have a type I core/shell structure where an energy level bandgap of the core 110 is within an energy level bandgap of the shell 120. In case of using the type I core/shell structure, electrons and holes are transferred to the core 110 and recombined in the core 110. Since the core 110 emits light from exciton energies, it is possible to adjust luminance wavelengths by adjusting sizes of the core 310.

In another exemplary aspect, the inorganic luminescence particles 100 (e.g. QDs and/or QRs) may have type II core/shell structure where the energy level bandgap of the core 110 and the shell 120 are staggered and electrons and holes are transferred to opposite directions among the core 110 and the shell 120. In case of using the type II core/shell structure, it is possible to adjust luminescence wavelengths as the thickness and the energy bandgap locations of the shell 120.

In still another exemplary aspect, the inorganic luminescence particles 100 (e.g. QDs and/or QRs) may have reverse type I core/shell structure where the energy level bandgap of the core 110 is wider than the energy level bandgap of the shell 320. In case of using the reverse type I core/shell structure, it is possible to adjust luminescence wavelengths as thickness of the shell 120.

As an example, when the inorganic luminescence particle 100 (e.g. QDs and/or QRs) has a type-I core/shell structure, the core 110 is a region where luminescence substantially occurs, and a luminescence wavelength of the inorganic luminescence particle 100 is determined as the sizes of the core 110. To achieve a quantum confinement effect, the core 110 necessarily has a smaller size than the exciton Bohr radius according to material of the inorganic luminescence particle 300, and an optical bandgap at a corresponding size.

The shell 120 of the inorganic luminescence particles 100 (e.g. QDs and/or QRs) promotes the quantum confinement effect of the core 110, and determines the stability of the particles 100. Atoms exposed on a surface of colloidal inorganic luminescence particles 100 (e.g. QDs and/or QRs) having only a single structure have lone pair electrons which do not participate in a chemical bond, unlike the internal atoms. Since energy levels of these surface atoms are between the conduction band edge and the valance band edge of the inorganic luminescence particles 100 (e.g. QDs and/or QRs), the charges may be trapped on the surface of the inorganic luminescence particles 100 (e.g. QDs and/or QRs), and thereby resulting in surface defects. Due to a non-radiative recombination process of excitons caused by the surface defects, the luminous efficiency of the inorganic luminescence particles 100 may be degraded, and the trapped charges may react with external oxygen and compounds, leading to a change in the chemical composition of the inorganic luminescence particles 100, or to a permanent loss of the electrical/optical properties of the inorganic luminescence particles 100.

To effectively form the shell 120 on the surface of the core 110, a lattice constant of the material in the shell 120 needs to be similar to that of the material in the core 110. As the surface of the core 110 is enclosed by the shell 120, the oxidation of the core 110 may be prevented, the chemical stability of the inorganic luminescence particles 100 (e.g. QDs and/or QRs) may be enhanced, and the photo-degradation of the core 110 by an external factor such as water or oxygen may be prevented. In addition, the loss of excitons caused by the surface trap on the surface of the core 110 may be minimized, and the energy loss caused by molecular vibration may be prevented, thereby enhancing the quantum efficiency.

In one exemplary aspect, each of the core 110 and the shell 120 may include, but is not limited to, a semiconductor nanocrystal and/or metal oxide nanocrystal having quantum confinement effect. For example, the semiconductor nanocrystal of the core 110 and the shell 120 may be selected from the group, but is not limited to, consisting of Group II-VI compound semiconductor nanocrystal, Group III-V compound semiconductor nanocrystal, Group IV-VI compound semiconductor nanocrystal, Group I-III-VI compound semiconductor nanocrystal and combination thereof.

Particularly, Group II-VI compound semiconductor nanocrystal of the core 110 and/or the shell 120 may be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof.

Group III-V compound semiconductor nanocrystal of the core and/or shell may be selected from the group, but is not limited to, consisting of AlN, AlP, AlAs, AlSb, GaN, GaP, GaAs, GaSb, InN, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystal of the core 110 and/or shell 120 may be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group I-III-VI compound semiconductor nanocrystal of the core 110 and/or shell 120 may be selected from the group, but is not limited to, $AgGaS_2$, $AgGaSe_2$, $AgGaTe_2$, $AgInS_2$, $CuInS_2$, $CuInSe_2$, $Cu_2SnS_3$, $CuGaS_2$, $CuGaSe_2$ and combination thereof. Alternatively, each of the core 110 and the shell 120 may independently include multiple layers each of which has different Groups compound semiconductor nanocrystal, e.g., Group II-VI compound semiconductor nanocrystal and Group III-V compound semiconductor nanocrystal such as InP/ZnS, InP/ZnSe, GaP/ZnS, and the likes, respectively.

In another aspect, the metal oxide nanocrystal of the core 110 and/or shell 120 may include, but are not limited to, Group II or Group III metal oxide nanocrystal. As an example, the metal oxide nanocrystal of the core 310 and/or the shell 320 may be selected from the group, but is not limited to, MgO, CaO, SrO, BaO, $Al_2O_3$ and combination thereof.

The semiconductor nanocrystal of the core 110 and/or the shell 120 may be doped with a rare earth element such as Eu, Er, Tb, Tm, Dy or an arbitrary combination thereof or may be doped with a metal element such as Mn, Cu, Ag, Al or an arbitrary combination thereof.

As an example, the core 110 in the inorganic luminescent particle 100 may include, but is not limited to, ZnSe, ZnTe, CdSe, CdTe, InP, ZnCdS, CuxIn1xS, CuxIn1-xSe, AgxIn1-xS and combination thereof. The shell 120 in the inorganic luminescent particle 100 may include, but is not limited to, ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, CdXZn1-xS and combination thereof.

In another exemplary aspect, the inorganic luminescence particle 100 may include, but are not limited to, alloy QD or alloy QR such as homogenous alloy QD or QR or gradient alloy QD or QR, e.g. CdSxSe1-x, CdSexTe1-x, CdXZn1-xS, ZnxCd1-xSe, CuxIn1-xS, CuxIn1-xSe, AgxIn1-xS.

The ligand 130 bound to the surface of the shell 120 is not particularly limited. In one exemplary aspect, the ligand 133 may be an organic ligand having a negative charge (−), that is, an X-type ligand at one or more terminals thereof. For example, the X-type ligand may have a negatively charged group selected from the group consisting of a carboxylate group (—COO⁻), a phosphonate group (—P(OR)₃) and a thiolate group (—RS) (for example, R is hydrogen, $C_1$-$C_{20}$ aliphatic hydrocarbon, $C_6$-$C_{30}$ aromatic group or a $C_3$-$C_{30}$ hetero aromatic group). For example without limitation, the X-type ligand 130 having the negative charge may be bound to the surface of the shell 120 though the terminal carboxylate group. In this case, the negatively charged group, for example, the carboxylate group, in the X-type ligand 130 may electrically interact with the metal constituting the shell 120.

As an example, the ligands 130 having the terminal carboxylate group may be derived from, but is not limited to, a saturated or unsaturated $C_5$-$C_{30}$ aliphatic carboxylic acid, preferably a saturated or unsaturated $C_8$-$C_{20}$ aliphatic carboxylic acid. More particularly, the ligand 130 having the terminal carboxylate group may be derived from a saturated or unsaturated aliphatic carboxylic acid such as octanoic acidCH$_3$(CH$_2$)$_6$COOH), decanoic acid (CH$_3$(CH$_2$)$_8$COOH), dodecanoic acid (or lauric acid, CH$_3$(CH$_2$)$_{10}$COOH), 1-tetradicanoic acid(or myristic acid, CH$_3$(CH$_2$)$_{12}$COOH), n-hexadecanoic acid (or palmitic acid, CH$_3$(CH$_2$)$_{14}$COOH), n-octadecanoic acid (or stearic acid, CH$_3$(CH$_2$)$_{16}$COOH), cis-9-octadecenoic acid (or oleic acid, CH$_3$(CH$_2$)$_7$CH=CH(CH$_2$)$_7$COOH).

In an alternative aspect, the ligands 130 may be an organic ligand bound to the surface of the metal constituting the shell 120 through lone pair electrons, that is, an L-type ligand. The organic ligands 130 having the lone pair electrons may interact with the metal component constituting the shell 120 by coordinating with the metal component through the lone pair electrons of the group selected from an amino group (—NR$_2$), a thiol group (—SH), a phosphine group (—PR) and a phosphine oxide group (—POR) (for example, R is hydrogen, $C_1$-$C_{20}$ aliphatic hydrocarbon, $C_6$-$C_{30}$ aromatic group or a $C_3$-$C_{30}$ hetero aromatic group). As an example, when the organic ligand 133 has a terminal amino group including the lone pair electrons, the nitrogen atom in the amino group is strongly bonded to the metal component of the shell 120 by the coordination bonds between the nitrogen atom and the metal component.

For example, the organic ligand 133 having the lone pair electrons may be selected from, but is not limited to, $C_1$-$C_{10}$ alkyl amine (e.g. primary, secondary or tertiary alkyl amine), preferably linear or branched $C_1$-$C_5$ alkyl amine; $C_4$-$C_8$ alicyclic amine, preferably $C_4$-$C_8$ alicyclic amine; $C_5$-$C_{20}$ aromatic amine, preferably $C_5$-$C_{10}$ aromatic amine; linear or branched $C_1$-$C_{10}$ alkyl phosphine (e.g. primary, secondary or tertiary alkyl phosphine), preferably linear or branched $C_1$-$C_5$ alkyl phosphine; linear or branched $C_1$-$C_{10}$ alkyl phosphine oxide (e.g. primary, secondary or tertiary alkyl phosphine oxide), preferably linear or branched $C_1$-$C_5$ alkyl phosphine oxide and combination thereof.

In one exemplary aspect, the organic ligand 130 having the lone pair electrons may comprise, but is not limited to, tertiary amines such as tris(2-aminoethy)amine (TAEA) and tris(2-aminomethyl)amine; alkyl polyamines such as N-butyl-N-ethylethane-1,2-diamine, ethylene diamine and pentaethylenehexamine); alicyclic amines such as cyclohexane-1,2-diamine and cyclohexene-1,2-diamine; aromatic amines 2,3-diaminopyridine; and combination thereof.

[Light Emitting Film, LED package and Liquid Crystal Display Device]

As described above, the polyurethane-based dispersant 150 enables the inorganic luminescent particle 100 to improve its dispersion properties, thermal resistance and luminous properties. The inorganic luminescent particle 100 dispersed in the polyurethane-based dispersant can be applied into various light emitting apparatuses. We will now describe a light emitting film, an LED package and a display device that can be fabricated from the composition including the inorganic luminescent particle 100 dispersed in the polyurethane-based dispersant.

Figure 3:
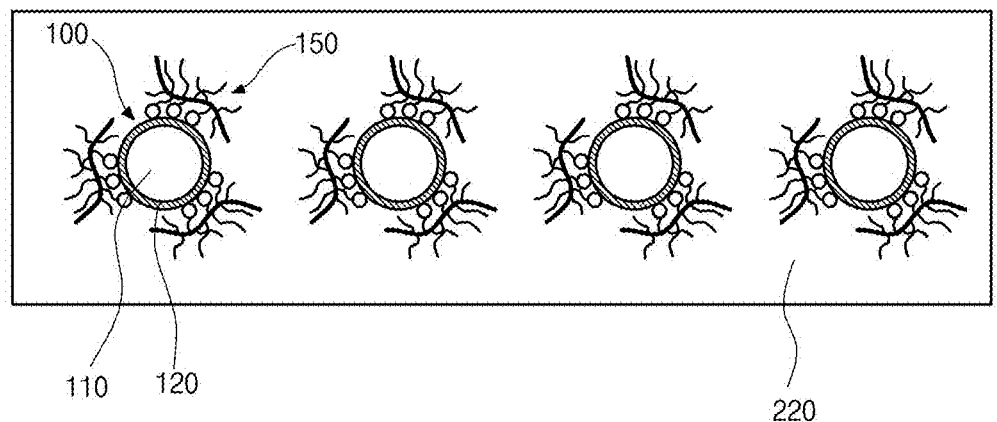
FIG. 3 is a cross-sectional view schematically illustrating the structure of a light emitting film in accordance with an exemplary aspect of the present disclosure where the light emitting film comprises inorganic luminescent particles and the dispersants.

FIG. 3 is a cross-sectional view schematically illustrating the structure of a light emitting film in accordance with an exemplary aspect of the present disclosure where the light emitting film comprises inorganic luminescent particles and the dispersants. As illustrated in FIG. 3, the light emitting film 200 comprises the dispersant 150 adsorbed on a surface of the inorganic luminescent particle 100. The inorganic luminescent particle 100 may comprise a quantum dot or a quantum rod having the heterologous structure of the core 110 and the shell 120. As an example, the inorganic luminescent particle 100 can implement various colors by adjusting the kinds and sizes of the core 110, and can reduce trap energy level by using the shell 120 that protects the core 110. While shown in FIG. 3, the dispersant 150 includes the extended pillar structure 154 (see, FIG. 2) as the side chain of the polyurethane main chain 152 (see, FIG. 2) and an adsorbed site 156 (see, FIG. 2) positioned adjacently to the pillar structure 154 and anchored to the surface of the inorganic luminescent particle 100 in the polyurethane main chain 152.

As the polyurethane-based dispersant 150 having the pillar structure 154 is adsorbed to the surface of the inorganic luminescent particle 100, the inorganic luminescent particle 100 can improve its dispersion properties and can minimize the deterioration of the thermal resistance and luminous efficiency. For example, the light emitting film 200 may comprise, but is not limited to, the inorganic luminescent particle 100 between about 20 parts by weight and between 30 parts by weight, and the polyurethane-based dispersant 150 between about 30 parts by weight and about 50 parts by weight. As used herein, the term 'part by weight' indicates a relative weight ratio among the mixed components.

The light emitting film 200 may further comprises a binder 220. As an example, the binder 220 may comprise, but is not limited to, epoxy resin and/or a silicone resin having excellent thermal resistance property. The contents of the binder 220 in the light emitting film 200 may be between about 20 parts by weight and about 50 parts by weight.

Figure 4:
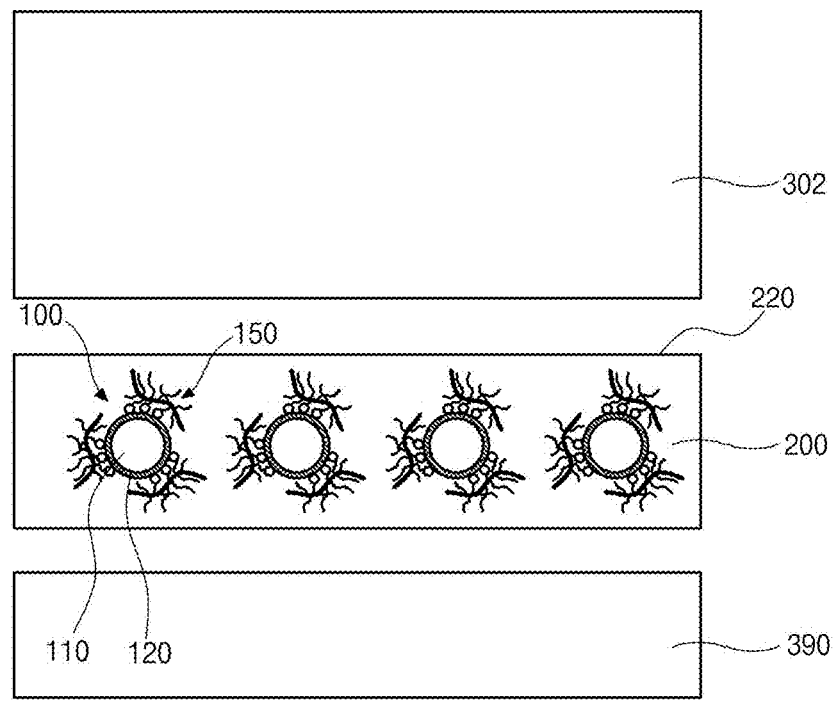
FIG. 4 is a cross-sectional view schematically illustrating a display device in accordance with an exemplary aspect of the present disclosure where the display device comprises inorganic luminescent particles and the dispersants applied in the light emitting film.
Figure 5:
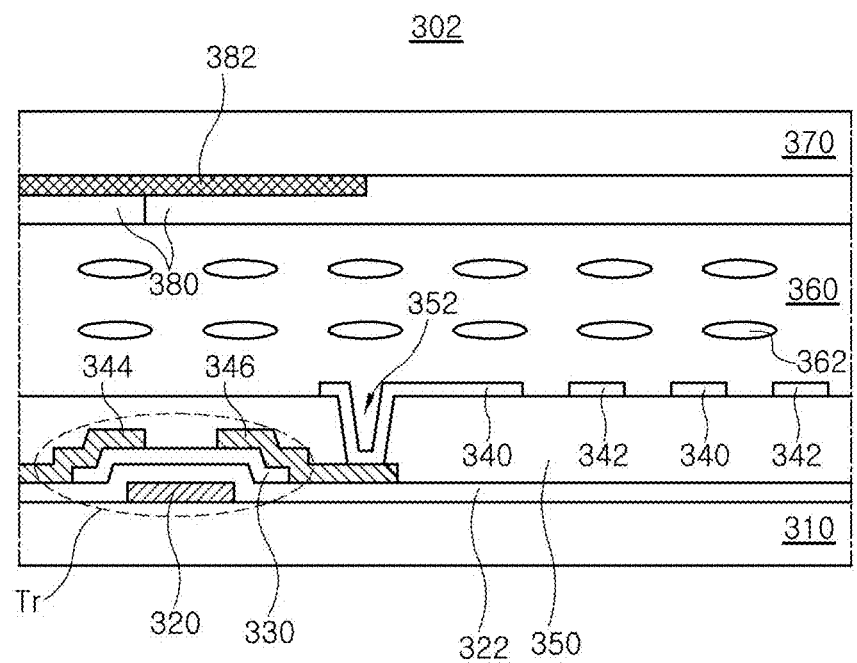
FIG. 5 is a cross-sectional view schematically illustrating a display panel constituting the display device in accordance with another exemplary aspect of the present disclosure.

FIG. 4 is a cross-sectional view schematically illustrating a display device in accordance with an exemplary aspect of the present disclosure where the display device comprises inorganic luminescent particles and the dispersants applied in the light emitting film. FIG. 5 is a cross-sectional view schematically illustrating a display panel constituting the display device in accordance with another exemplary aspect of the present disclosure.

As illustrated in FIG. 4, a liquid crystal display (LCD) device 300 comprises a liquid crystal panel 302, a backlight unit 390 disposed under the liquid crystal panel 302, and a light-emitting film 200 disposed between the liquid crystal panel 302 and the backlight unit 390. The light emitting film 200 may comprise the dispersant 150 adsorbed to the surface of the inorganic luminescent particle 100 and the binder 200.

With referring to FIG. 5, the liquid crystal panel 302 includes first and second substrates 310 and 370, and a liquid crystal layer 360 interposed between the first and second substrates 310 and 370 and including liquid crystal molecules 362. The first substrate 310 may be made of transparent materials, and may be, but is not limited to, a glass substrate, a thin flexible substrate or a polymeric plastic substrate. The second substrate 370 may be made of transparent or obscured materials. For example, the second substrate 370 may be made of glass, plastics such as polyimide, metal foil, and the like.

A gate electrode 320 is formed on the first substrate 310, and a gate insulating layer 322 is formed to cover the gate electrode 320. In addition, a gate line (not shown) connected to the gate electrode 320 is formed on the first substrate 310. The gate insulating layer 322 may be made of inorganic material such as silicon oxide ($SiO_x$) and/or silicon nitride ($SiN_x$)

On the gate insulating layer 320, a semiconductor layer 330 is formed to correspond to the gate electrode 320. The semiconductor layer 330 may consist of an oxide semiconductor material. However, the semiconductor layer 330 may include an active layer consisting of amorphous silicon and an ohmic contact layer consisting of amorphous silicon with impurities.

On the semiconductor layer 330, a source electrode 344 and a drain electrode 346 are formed to be spaced apart from each other. In addition, a data line (not shown) connected to the source electrode 344 intersects with the gate line to define a pixel area. The gate electrode 320, the semiconductor layer 330, the source electrode 344 and the drain electrode 346 constitute a thin film transistor Tr.

On the thin film transistor Tr, a passivation layer 350 having a drain contact hole 352 exposing the drain electrode 346 is formed. The passivation layer 350 may be made of inorganic insulating material such as silicon oxide ($SiO_x$) and silicon nitride ($SiN_x$) and/or organic insulating material such as benzocyclobutene or photo-acryl. On the passivation layer 350, a pixel electrode 340, which is a first electrode connected to the drain electrode 346 by a drain contact hole 352, and a common electrode 342 which is a second electrode alternately arranged with a pixel electrode 340, are formed.

Meanwhile, a black matrix 382 covering a non-display region which includes the thin film transistor Tr, the gate line, the data line, etc. is formed on the second substrate 370. In addition, color filter layers 380 are formed to correspond to pixel areas.

The first and second substrates 310 and 370 are combined to have the liquid crystal layer 360 disposed between them, and the liquid crystal molecules 362 of the liquid crystal layer 360 are driven by an electric field generated between the pixel electrode 340 and the common electrode 342. Although not shown in FIG. 5, an alignment layer may be formed in contact with the liquid crystal layer 360 on each of the first and second substrates 310 and 370, and polarizers having transmission axes perpendicular to each other may be attached to the outer surfaces of the first and second substrates 310 and 370, respectively.

Referring back to FIG. 4, the backlight unit 390 includes a light source (not shown) and provides light to the liquid crystal panel 302. The backlight unit 390 may be classified into a direct type and a side type according to the position of a light source. When the backlight unit 390 is of a direct type, the backlight unit 390 may include a bottom frame (not shown) covering the lower part of the liquid crystal panel 302 and a plurality of light sources may be arranged on a horizontal surface of the bottom frame. Meanwhile, when the backlight unit 390 is of a side type, the backlight unit 390 may include a bottom frame (not shown) covering the lower part of the liquid crystal panel 302, a light guide plate (not shown) may be disposed on the horizontal surface of the bottom frame, and light sources may be disposed on at least one part of the light guide plate. Here, the light source may emit light at a wavelength range of blue light, for example, within a wavelength ranging from approximately 430 to 470 nm.

The light emitting film 200 may be disposed between the liquid crystal panel 302 and the backlight unit 390, and enhance a color purity of light provided by the backlight unit 390. For example, the light emitting film 200 may include the polyurethane-based dispersant 150 adsorbed to the surface of the inorganic luminescent particle 100 such as a quantum dot and/or a quantum rod and the binder 200 enclosing the inorganic luminescent particle 100 and the dispersant 150.

Figure 6:
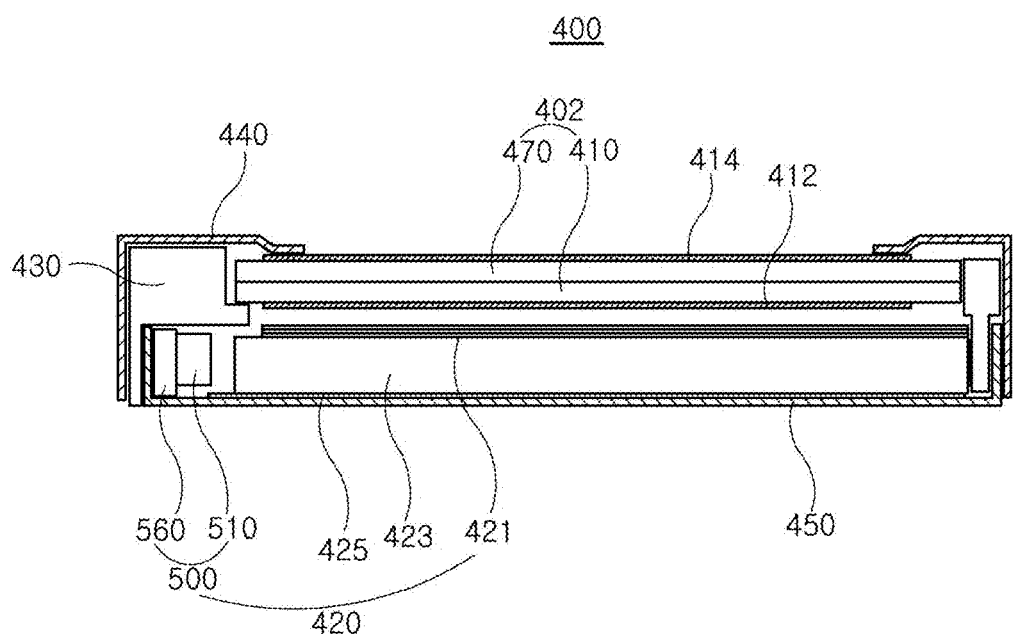
FIG. 6 is a cross-sectional view schematically illustrating a display device in accordance with another exemplary aspect of the present disclosure.

Now, an LED package to which the composition including the dispersant adsorbed to the inorganic luminescent particle is applied will be described. FIG. 6 is a cross-sectional view schematically illustrating a display device in accordance with another exemplary aspect of the present disclosure.

As illustrated in FIG. 6, the liquid crystal display device 400 includes a liquid crystal panel 402 as a display panel, a backlight unit 420 under the liquid crystal panel 402. The display device 400 may further include a main frame 430, a top frame 440 and a bottom frame 450 for modularizing the liquid crystal panel 402 and the backlight unit 420. The liquid crystal panel 402 includes first and second substrates 410 and 470 and a liquid crystal layer 360 (of FIG. 5) therebetween. Since the liquid crystal panel 402 may have similar structure as those in FIG. 5, the explanation is omitted. First and second polarization plates 412 and 414 transmitting a predetermined light are attached on an outer surface of the first and second substrates 410 and 470, respectively. A linearly-polarized light being parallel to a direction of a transmissive axis of the first and second polarization plates 412 and 414 passes through the first and second polarization plates 412 and 414. For example, the transmissive axis of the first and second polarization plates 412 and 414 may be perpendicular to each other.

Although not shown, a printed circuit board (PCB) may be connected to at least one side of the liquid crystal panel 402 via a connection member, for example, a flexible PCB or a tape carrier package. The PCB is bent along a side surface of the main frame 430 or a rear surface of the bottom frame 450 during a modularization process of the display device 400.

The backlight unit 420 providing the light is disposed under the liquid crystal panel 402 in order to display externally the transmittance differences by the liquid crystal panel 402. The backlight unit 420 includes a light emitting diode (LED) assembly 500, a reflective plate 425 of white or silver, a light guide plate 423 on the reflective plate 425 and an optical sheet 421 on the light guide plate 423.

In one exemplary aspect, the LED assembly 500 is disposed at a side of the light guide plate 223 and includes a plurality of LED packages 510 and an LED PCB 560. The LED packages 510 are arranged on the PCB 560. Each LED package 510 may comprise an LED chip 512 (see FIG. 7) emitting red, green and blue lights or white light such that white light is provided from the LED package 510 toward the light guide plate 423. Alternatively, adjacent three LED packages 510 respectively emit red, green and blue lights, and the lights are mixed to provide the white light.

The LED PCB 560 is an electronic circuit board that prints a wring pattern (not shown) on an insulating layer made of resin or ceramic to mount electronic devices and enables electrical connection with the LED package 510. As an example, the LED PCB 560 may be, but is not limited to, a FR-4 printed circuit board made a reinforced-glass epoxy laminated sheet, a flexible printed circuit board (FPCB) or metal core printed circuit board (MCPCB).

The light from the LED package 510 of the LED assembly 500 is incident into the light guide plate 423. The light travels the light guide plate 423, and a plane light source is provided onto the liquid crystal panel 402 by a total reflection in the light guide plate 423. Patterns for providing uniform plane light may be formed on a rear surface of the light guide plate 423. For example, the patterns of the light guide plate 423 may be an elliptical pattern, a polygonal pattern or a hologram pattern, and those patterns may be formed through a printing process or an injection molding.

The reflective plate 425 is disposed under the light guide plate 423, and the light from the rear side of the light guide plate 423 is reflected by the reflective plate 425 to improve the brightness. The optical sheet 421 on or over the light guide plate 423 may include a light diffusion sheet or at least one light concentration sheet so that the light passed though the light guide plate 423 diffuses or focuses to provide uniform plane light to the liquid crystal panel 402. The LED packages 510 may be arranged in a plurality of lines on the LED PCB 560.

The liquid crystal panel 402 and the backlight unit 420 are modularized by the main frame 430, the top frame 440 and the bottom frame 450. The top frame 440 covers edges of a front surface of the liquid crystal panel 402 and side surfaces of the liquid crystal panel 402. The top frame 440 has an opening such that images from the liquid crystal panel 402 can be displayed through the opening of the top frame 440. The bottom frame 450 includes a bottom surface and four side surfaces to cover a rear surface of the backlight unit 420 and side surfaces of the backlight unit 420. The bottom frame 450 covers a rear side of the backlight unit 420. The main frame 430 has a rectangular frame shape. The main frame 430 covers side surfaces of the liquid crystal panel 402 and the backlight unit 420 and is combined with the top frame 440 and the bottom frame 450.

Figure 7:
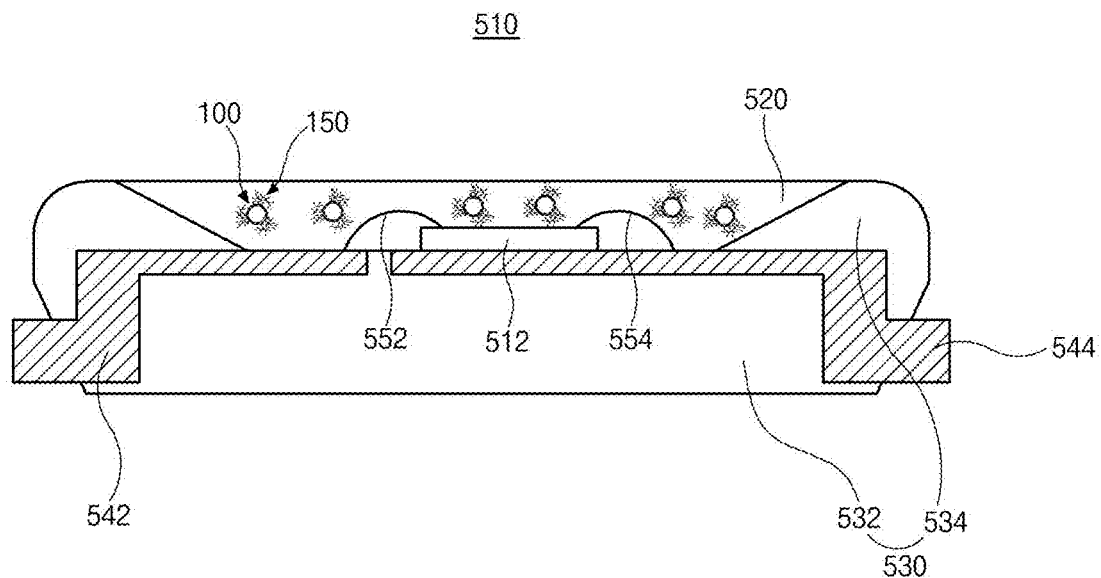
FIG. 7 is a cross-sectional view schematically illustrating an LED package in accordance with an exemplary aspect of the present disclosure where inorganic luminescent particles and the dispersants are applied to an encapsulation part.

FIG. 7 is a cross-sectional view schematically illustrating an LED package in accordance with an exemplary aspect of the present disclosure where inorganic luminescent particles and the dispersants are applied to an encapsulation part. As illustrated in FIG. 7, the LED package 510 includes an LED chip 512, and an encapsulation part 520 covering the LED chip 512. The encapsulation part 520 includes the polyurethane-based dispersant 150 adsorbed to the surface of the inorganic luminescent particle 100 that may be a quantum dot and/or a quantum rod as the luminous material.

In one exemplary aspect, the LED package 510 may be a white LED package which can realize white luminescence. One method of realizing white light includes using an LED chip 512 enabling ultraviolet (UV) luminescence as a light source, and injecting the polyurethane-based dispersant 150 adsorbed to the surface of the inorganic luminescent particle 100 that can emit red (R), green (G) and blue (B) lights in the encapsulation part 520. Another method of realizing white light is using an LED chip 512, for example, emitting blue light, and injecting the polyurethane-based dispersant 150 adsorbed to the surface of the inorganic luminescent particle 100 that can emit red (R), yellow (Y) and/or green (G) lights that can absorb the blue light emitted from the LED chip 512 in the encapsulation part 520.

For example, the LED chip 512 may be a blue LED chip emitting light of a wavelength range of approximately 430 to 470 nm, and the inorganic luminescent particle 100 may be a quantum dot or a quantum rod emitting light of a green wavelength range and/or a red wavelength range. In one exemplary aspect, the LED chip 512 emitting blue light may use sapphire as a substrate, and a material having a blue peak wavelength may be applied as a light source for excitation. As an example, a material for the blue LED chip 510 may be selected from, but is not limited to, the group consisting of GaN, InGaN, InGaN/GaN, $BaMgAl_{10}O_7:Eu^{2+}$, $CaMgSi_2O_6:Eu^{2+}$ and a combination thereof.

In this case, the inorganic luminescent particle 100 may have predetermined photoluminescence wavelengths absorbing strongly the blue light emitted from the blue LED chip 510. The inorganic luminescent particle 100 may be applied on, for example, the LED chip 512 emitting blue light, thereby overall realizing a white LED.

In addition, the LED package 510 may further include a case 530, and first and second electrode leads 542 and 544 connected to the LED chip 512 via first and second wires 552 and 554 and exposed to the outside of the case 530. The case 530 includes a body 532 and a side wall 534 protruding from the top surface of the body 532 to serve as a reflecting surface, and the LED chip 512 is disposed above the body 532, and surrounded by the side wall 534.

As described above, the polyurethane-based dispersant 150 adsorbed to the surface of the inorganic luminescent particle 100 introduces the pillar structure 154 (142) having the predetermined length and chemical conformations, thus the inorganic luminescent particle 100 can improve its dispersion properties and have excellent thermal resistance and luminous efficiency. As the inorganic luminescent particle 100 adsorbed by the dispersant 150 can maintain its excellent physical properties even when the heat emitted from the high temperature LED chip 512 is transferred to the encapsulation part 520, it can maintain the intended luminous properties. Accordingly, a luminance of the LED package 510 including the inorganic luminescent particle 100 and the dispersant 150 may increase, and the luminance of an LCD device 400 including the LED package 510 is greatly enhanced.

[Inorganic LED and Light Emitting Device]

Figure 8:
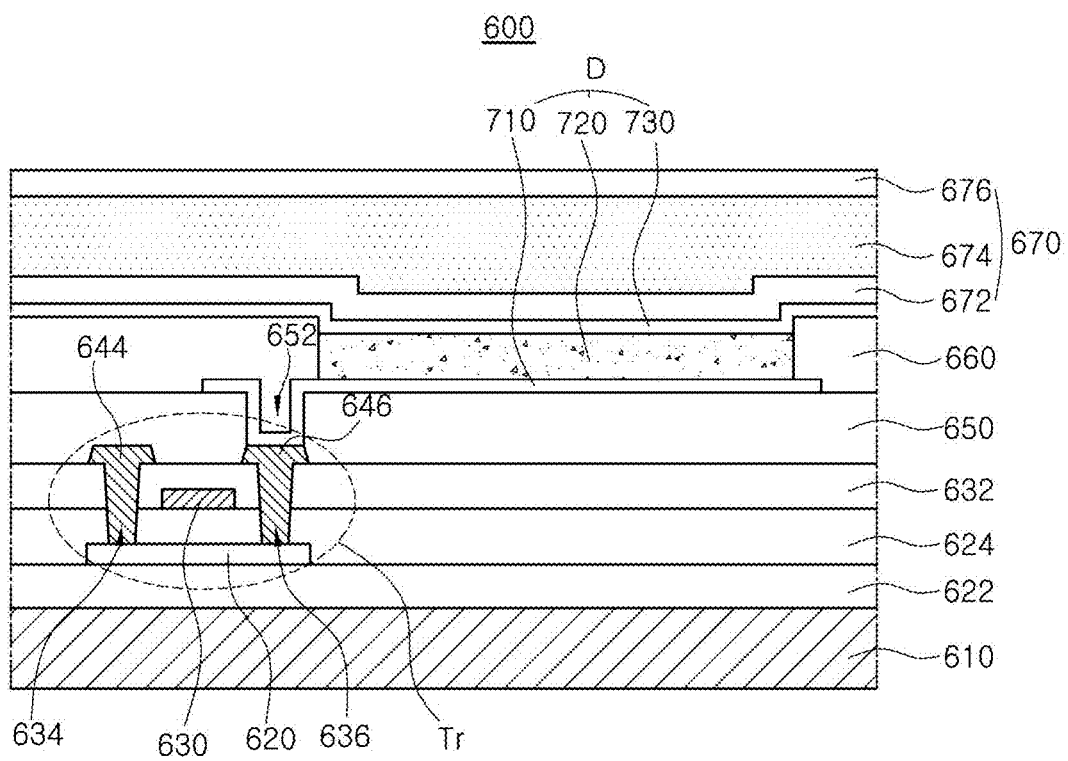
FIG. 8 is a cross-sectional view schematically illustrating inorganic light emitting display device in accordance with another exemplary aspect of the present disclosure where inorganic luminescent particles and dispersants are applied into an emissive layer.

As described above, the polyurethane-based dispersant 150 having the pillar structure can be adsorbed stably to the surface of the inorganic luminescent particle 100, thus the inorganic luminescent particle 100 can have excellent thermal property, dispersion property and luminous efficiency. Accordingly, the inorganic luminescent particle 100 of which the dispersant 150 is adsorbed on the surface can be introduced into an emissive layer of an inorganic light emitting diode and can be utilized in an inorganic light emitting device. FIG. 8 is a cross-sectional view schematically illustrating inorganic light emitting display device in accordance with another exemplary aspect of the present disclosure where inorganic luminescent particles and dispersants are applied into an emissive layer. All component of the inorganic light emitting display device in accordance with all aspects of the present invention are operatively coupled and configured.

As illustrated in FIG. 8, an inorganic light emitting display device 600 includes a substrate 610, a thin film transistor Tr over the substrate 6610 and an inorganic light emitting diode D connected to the thin film transistor Tr.

The substrate 610 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 610, over which the thin film transistor Tr and the LED D are arranged, form an array substrate.

A buffer layer 622 may be disposed over the substrate 610, and the thin film transistor Tr is disposed over the buffer layer 622. The buffer layer 622 may be omitted.

A semiconductor layer 620 is disposed over the buffer layer 622. In one exemplary aspect, the semiconductor layer 620 may include, but is not limited to, oxide semiconductor materials. In this case, a light-shied pattern may be disposed under the semiconductor layer 620, and the light-shield pattern can prevent light from being incident toward the semiconductor layer 620, and thereby preventing the semiconductor layer 120 from being deteriorated by the light. Alternatively, the semiconductor layer 620 may include polycrystalline silicon. In this case, opposite edges of the semiconductor layer 620 may be doped with impurities.

A gate insulating layer 624 made of an insulating material is disposed on the semiconductor layer 620. The gate insulating layer 624 may include, but is not limited to, an inorganic insulating material such as silicon oxide ($SiO_x$) or silicon nitride ($SiN_x$).

A gate electrode 630 made of a conductive material such as a metal is disposed over the gate insulating layer 624 so as to correspond to a center of the semiconductor layer 620. While the gate insulating layer 624 is disposed over a whole area of the substrate 610 in FIG. 8, the gate insulating layer 624 may be patterned identically as the gate electrode 630.

An interlayer insulating layer 632 made of an insulating material is disposed on the gate electrode 630 with covering over an entire surface of the substrate 610. The interlayer insulating layer 632 may include, but is not limited to, an inorganic insulating material such as silicon oxide ($SiO_x$) or silicon nitride (SiNO, or an organic insulating material such as benzocyclobutene or photo-acryl.

The interlayer insulating layer 632 has first and second semiconductor layer contact holes 634 and 636 that expose both sides of the semiconductor layer 620. The first and second semiconductor layer contact holes 634 and 636 are disposed over both sides of the gate electrode 630 with spacing apart from the gate electrode 630. The first and second semiconductor layer contact holes 634 and 636 are formed within the gate insulating layer 624 in FIG. 8. Alternatively, the first and second semiconductor layer contact holes 634 and 636 are formed only within the interlayer insulating layer 632 when the gate insulating layer 624 is patterned identically as the gate electrode 630.

A source electrode 644 and a drain electrode 466, each of which includes a conductive material such as a metal, are disposed on the interlayer insulating layer 632. The source electrode 644 and the drain electrode 646 are spaced apart from each other with respect to the gate electrode 630, and contact both sides of the semiconductor layer 620 through the first and second semiconductor layer contact holes 634 and 636, respectively.

The semiconductor layer 620, the gate electrode 630, the source electrode 644 and the drain electrode 646 constitute the thin film transistor Tr, which acts as a driving element. The thin film transistor Tr in FIG. 8 has a coplanar structure in which the gate electrode 630, the source electrode 644 and the drain electrode 646 are disposed over the semiconductor layer 620. Alternatively, the thin film transistor Tr may have an inverted staggered structure (see, FIG. 5) in which a gate electrode is disposed under a semiconductor layer and source and drain electrodes are disposed over the semiconductor layer. In this case, the semiconductor layer may include, but are not limited to, amorphous silicon.

Although not shown in FIG. 8, a gate line and a data line, which cross each other to define a pixel region, and a switching element, which is connected to the gate line and the data line, may be further formed in the pixel region. The switching element is connected to the thin film transistor Tr, which is a driving element. In addition, a power line is spaced apart in parallel from the gate line or the data line, and the thin film transistor Tr may further includes a storage capacitor configured to constantly keep a voltage of the gate electrode for one frame.

Moreover, the inorganic light emitting display device 600 may include a color filter that comprises dyes or pigments for transmitting specific wavelength light of light emitted from the LED D. For example, the color filter can transmit light of specific wavelength such as red (R), green (G), blue (B) and/or white (W). Each of red, green, and blue color filter may be formed separately in each pixel region. In this case, the inorganic light emitting display device 800 can implement full-color through the color filter.

A passivation layer 650 is disposed on the source and drain electrodes 644 and 646 over the whole substrate 610. The passivation layer 650 has a flat top surface and a drain contact hole 652 that exposes the drain electrode 646 of the thin film transistor Tr. While the drain contact hole 652 is disposed on the second semiconductor layer contact hole 636, it may be spaced apart from the second semiconductor layer contact hole 636.

The inorganic LED D includes a first electrode 710 that is disposed on the passivation layer 650 and connected to the drain electrode 646 of the thin film transistor Tr. The inorganic LED D further includes an emissive layer 720 and a second electrode 730 each of which is disposed sequentially on the first electrode 710.

The first electrode 710 is disposed in each pixel region. The first electrode 710 may be an anode and include a conductive material having relatively high work function value. For example, the first electrode 710 may include, but is not limited to, a doped or undoped metal oxide such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide ($F:SnO_2$), indium:tin oxide ($In:SnO_2$), gallium:tin oxide ($Ga:SnO_2$) or aluminum:zinc oxide (Al:ZnO; AZO). Optionally, the first electrode 210 may include a metal or nonmetal material such as nickel (Ni), platinum (Pt), gold (Au), silver (Ag), iridium (Ir) or a carbon nanotube (CNT), other than the above-described metal oxide.

In one exemplary aspect, when the inorganic light emitting display device 700 is a top-emission type, a reflective electrode or a reflective layer (not shown) may be disposed under the first electrode 710. For example, the reflective electrode or the reflective layer (not shown) may comprise, but are not limited to, aluminum-palladium-copper (APC) alloy. In addition, a bank layer 660 is disposed on the passivation layer 650 in order to cover edges of the first electrode 710. The bank layer 660 exposes a center of the first electrode 710.

An emissive layer 720 is disposed on the first electrode 710. In one exemplary aspect, the emissive layer 720 may have a mono-layered structure of an emitting material layer (EML). Alternatively, the emissive layer 720 may further include plural charge transfer layers as well as the EML. For example, the emissive layer 720 includes an EML 740 (see, FIG. 9), a first charge transfer layer (CTL1) 750 (see, FIG. 9) and a second charge transfer layer (CTL2) 770 (see, FIG. 9), and optionally an exciton charge layer. The emissive layer 720 may have one emitting unit or have multiple emitting units to form a tandem structure.

The second electrode 730 is disposed over the substrate 612 above which the emissive layer 720 is disposed. The second electrode 730 may be disposed over a whole display area, may include a conductive material having a relatively low work function value compared to the first electrode 710, and may be a cathode. For example, the second electrode 730 may include, but is not limited to, Ca, Ba, Ca/Al, LiF/Ca, LiF/Al, $BaF_2/Al$, CsF/Al, $CaCO_3/Al$, $BaF_2/Ca/Al$, Al, Mg, Au:Mg or Ag:Mg.

In addition, an encapsulation film 670 may be disposed over the second electrode 730 in order to prevent outer moisture from penetrating into the LED D. The encapsulation film 670 may have, but are not limited to, a laminated structure of a first inorganic insulating film 672, an organic insulating film 674 and a second inorganic insulating film 676.

Moreover, a polarizer may be attached to the encapsulation film 670 in order to decrease external light reflection. For example, the polarizer may be a circular polarizer. In addition, a cover window may be attached to the encapsulation film 670 or the polarizer. In this case, the substrate 610 and the cover window may have a flexible property, thus the inorganic light emitting display device 600 may be a flexible display device.

Figure 9:
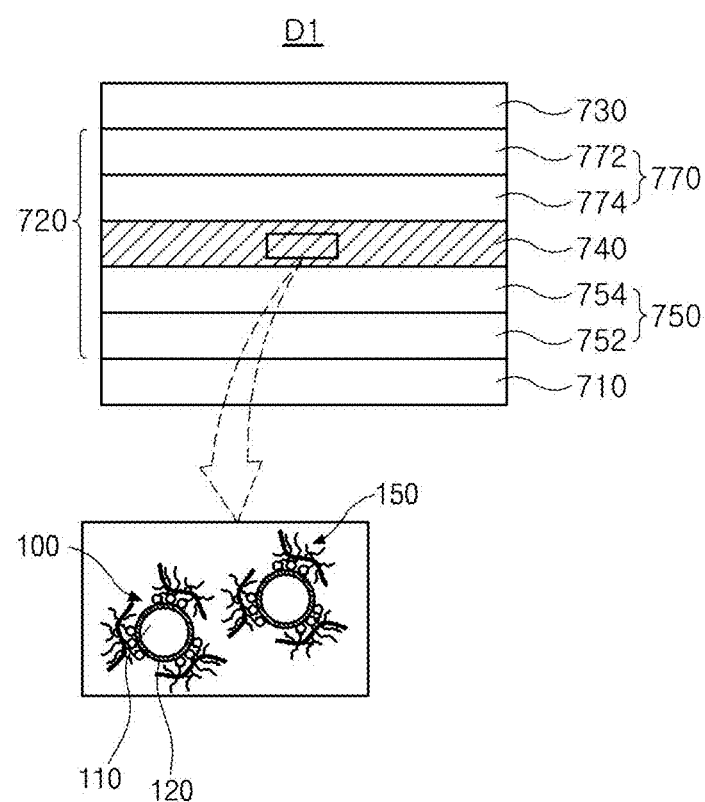
FIG. 9 is a cross-sectional view schematically illustrating an inorganic light emitting diode in accordance with an exemplary aspect of the present disclosure where inorganic luminescent particles and the dispersant are applied into an emissive layer.

The emissive layer 720 includes the dispersant 150 adsorbed to the surface of the inorganic luminescent particle 100 (see, FIG. 9). The inorganic luminescent particle 100 has excellent dispersion property and can maintain its thermal resistance and luminous efficiency even exposing the external oxygen, moisture and/or high temperature during the fabricating the inorganic LED D.

Now, we will describe the inorganic LED having the inorganic luminescent particle and the dispersant in more detail. FIG. 9 is a cross-sectional view schematically illustrating an inorganic light emitting diode in accordance with an exemplary aspect of the present disclosure where inorganic luminescent particles and the dispersant are applied into an emissive layer. As illustrated in FIG. 9, the inorganic LED D includes a first electron 710, a second electrode 730 and an emissive layer 720 disposed between the first electrode 710 and the second electrode 730. The emissive layer 730 comprises an EML 740. Also, the emissive layer 720 comprises a CTL1 750 disposed between the first electrode 710 and the EML 740 and a CTL2 770 disposed between the EML 740 and the second electrode 730. Alternatively, the emissive layer 720 may further comprise a first exciton blocking layer, an electron blocking layer (EBL, not shown) disposed between the EML 740 and the CTL1 750 and/or a second exciton blocking layer, a hole blocking layer (HBL, not shown) disposed between the EML 740 and the CTL2 770.

The first electrode 710 may be an anode such as a hole injection electrode. The first electrode 710 may be formed on a substrate 610 (see, FIG. 8) formed of glass or a polymer. As an example, the first electrode 710 may be a doped or undoped metal oxide such as ITO, IZO, ITZO, ICO, Snot, $In_2O_3$, Cd:ZnO, F:$SnO_2$, In:$SnO_2$, Ga:$SnO_2$) or AZO. Optionally, the first electrode 710 may consist of a metal or nonmetal material containing Ni, Pt, Au, Ag, Ir or a CNT, other than the above-described metal oxide.

The second electrode 730 may be a cathode such as an electron injection electrode. As an example, the second electrode 730 may consist of Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. As an example, each of the first electrode 710 and the second electrode 730 may be stacked to a thickness of 30 to 300 nm.

In one exemplary aspect, in the case of a bottom emission-type inorganic LED, the first electrode 710 may consist of a transparent conductive metal oxide such as ITO, IZO, ITZO or AZO, and as the second electrode 730, Ca, Ba, Ca/Al, LiF/Ca, LiF/Al, $BaF_2$/Al, Al, Mg, or an Ag:Mg alloy may be used.

The EML 740 comprises the dispersant 150 adsorbed to the surface of the inorganic luminescent particle 100 that may be the quantum dot or the quantum rod. The pillar structure 154 (see, FIG. 2) introduced into the dispersant 150 with predetermined length and chemical conformation enables the inorganic luminescent particle 100 to be dispersed in the polar solvent as well as the non-polar solvent.

The inorganic luminescent particles 100 can minimize their agglomerations and FRET to adjacent distributed particles due to the sterical hindrance caused by the pillar structure 154. As the dispersant 150 is adsorbed stably to the inorganic luminescent particle 100, the particle 100 can maintain its luminous efficiency even exposing to the external oxygen, moisture and high temperature.

When the EML 740 comprises the inorganic luminescent particles 100 such as the quantum dots and the quantum rods and the dispersant adsorbed to the surface of the inorganic luminescent particle 100, the EML 740 may be formed using a solution in which the inorganic luminescent particles 100 adsorbed by the dispersant 150 is dispersed in a solvent. The EML 740 may be formed by applying the solution in which the inorganic luminescent particles 100 are dispersed by the dispersant 150 onto the CTL1 750, and then by evaporating the solution. In one exemplary aspect, the EML 740 including the inorganic luminescent particles 100 and the dispersant 150 may be laminated on the CTL1 750 using any solution process such as spin coating, drop coating, dip coating, spray coating, roll coating, flow coating casting, screen printing and inkjet printing, or a combination thereof.

The CTL1 750 may be a hole transfer layer which provides holes with the EML 740. As an example, the CTL1 750 may include a hole injection layer (HIL) 752 disposed adjacently to the first electrode 710 between the first electrode 710 and the EML 740, and a hole transport layer (HTL) 754 disposed adjacently to the EML 740 between the first electrode 710 and the EML 740.

The HIL 752 facilitates the injection of holes from the first electrode 710 into the EML 740. As an example, the HIL 752 may include, but is not limited to, an organic material selected from the group consisting of poly(ethylenedioxy-thiophene):polystyrenesulfonate (PEDOT:PSS); 4,4',4"-tris (diphenylamino)triphenylamines (TDATA) doped with tetrafluoro-tetracyano-quinodimethane (F4-TCNQ); p-doped phthalocyanine such as zinc phthalocyanine (ZnPc) doped with F4-TCNQ; N,N'-diphenyl-N,N'-bis(1-naphthyl)-1,1'-biphenyl-4,4"-diamine (α-NPD) doped with F4-TCNQ; hexaazatriphenylene-hexanitrile (HAT-CN); and a combination thereof. As an example, the HIL 752 may include the dopant such as F4-TCNQ between about 1 wt % to about 30 wt %. The HIL 752 may be omitted in compliance with a structure of the LED D.

The HTL 754 transports holes from the first electrode 710 into the EML 740. The HTL 754 may include an inorganic material or an organic material. As an example, when the HTL 754 includes an organic material, the HTL 754 may include, but is not limited to, 4,4'-bis(p-carbazolyl)-1,1'-biphenyl compounds such as CBP and CDBP; aromatic amines, i.e. aryl amines or polynuclear aromatic amines selected from the group consisting of α-NPD, N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)pheyl)-N,N'-diphenylbenzidine (DNTPD), tris(4-carbazolyl-9-ylphenyl) amine (TCTA), tetra-N-phenylbenzidine (TPB), tris(3-methylphenylphenylamino)-triphenylamine (m-MTDATA), poly (9,9'-dioctylfluorenyl-2,7-diyl)-co-(4,4'-(N-(4-sec-butylphenyl)diphenylamine (TFB), poly(4-butylphenyl-dipnehyl amine) (poly-TPD) and combination thereof; conductive polymers such as polyaniline, polypyrrole, PEDOT:PSS; PVK and its derivatives; poly(para)phenylene vinylenes (PPV) and its derivatives such as poly[2-methoxy-5-(2-ethylhexyloxy)-1,4-phenylene vinylene] (MEH-PPV), poly[2-methoxy-5-(3',7'-dimethyloctyloxy)-1,4-phenylene vinylene] (MOMO-PPV); polymethacrylate and its derivatives; poly(9,9-octylfluorene) and its derivatives; poly(spirofluorene) and its derivatives; metal complexes such as copper phthalocyanine (CuPc); and combination thereof.

Alternatively, when the HTL 754 includes an inorganic material, the HTL 754 may comprise an inorganic material selected from the group consisting of a metal oxide nanocrystal, a non-oxide metal nanocrystal and combination thereof. The metal oxide nanocrystal that can be used in the HTL 754 may be selected from, but is not limited to, the group consisting of ZnO, $TiO_2$, CoO, CuO, $Cu_2O$, FeO, $In_2O_3$, MnO, NiO, PbO, SnOx, $Cr_2O_3$, $_{v2}O_5$, $Ce_2O_3$, $MoO_3$, $Bi_2O_3$, $ReO_3$ and combination thereof. The non-oxide metal nanocrystal may comprise, but is not limited to, CuSCN, $Mo_2S$ and p-type GAN. Alternatively, the metal oxide and/or the non-oxide metal nanocrystal in the HTL 754 may be doped with a p-dopant. As an example, the p-dopant may be selected from, but is not limited to, $Li^+$, $Na^+$, $K^+$, $Sr^+$, $Ni^{2+}$, $Mn^{2+}$, $Pb^{2+}$, $Cu^+$, $Cu^{2+}$, $Co^{2+}$, $Al^{3+}$, $Eu^{3+}$, $In^{3+}$, $Ce^{3+}$, $Er^{3+}$, $Tb^{3+}$, $Nd^{3+}$, $Y^{3+}$, $Cd^{2+}$, $Sm^{3+}$, N, P, As and combination thereof.

In FIG. 8, while the CTL1 750 is divided into the HIL 752 and the HTL 754, the CTL1 750 may have a mono-layered structure. For example, the CTL1 750 may include only the HTL 754 without the HIL 752 or may include the above-mentioned hole transporting material doped with the hole injection material (e.g. PEDOT:PSS).

The CTL1 750 including the HIL 752 and the HTL 754 may be formed by any vacuum deposition process such as vacuum vapor deposition and sputtering, or by any solution process such as spin coating, drop coating, dip coating, spray coating, roll coating, flow coating, casting, screen printing and inkjet printing, or a combination thereof. For example, each of the HIL 752 and the HTL 754 may have a thickness, but is not limited to, between about 10 nm and 200 nm, alternatively, about 10 nm and 100 nm.

The CTL2 770 is disposed between the EML 740 and the second electrode 730. The CTL2 770 may be an electron transfer layer which provides electrons into the EML 740. In one exemplary aspect, the CTL2 770 may include an electron injection layer (EIL) 772 disposed adjacently to the second electrode 730 between the second electrode 730 and the EML 740, and an electron transport layer (ETL) 774 disposed adjacently to the EML 740 between the second electrode 730 and the EML 740.

The EIL 772 facilitates the injection of electrons from the second electrode 730 into the EML 740. For example, the EIL 772 may include, but is not limited to, a metal such as Al, Cd, Cs, Cu, Ga, Ge, In and/or Li, each of which is undoped or doped with fluorine; and/or metal oxide such as $TiO_2$, ZnO, $ZrO_2$, $SnO_2$, $WO_3$ and/or $Ta_2O_3$, each of which is undoped or doped with Al, Mg, In, Li, Ga, Cd, Cs or Cu.

The ETL 774 transfers electrons into the EML 740 and comprises an inorganic material or an organic material. In one exemplary aspect, when the EML 740 includes the inorganic luminescent particle 100, the ETL 774 may include an inorganic material so as to prevent an interface defect from being formed at an interface between the EML 740 and the ETL 774, and thereby securing driving stability of the LED D. In addition, when the ETL 774 includes an inorganic material having high charge mobility, the electron transport rate provided from the second electrode 730 may be improved, and electrons can be transported efficiently into the EML 740 owing to high electron levels or concentrations.

Moreover, when the EML 740 includes an inorganic luminescence particle 100, the inorganic luminescence particle 100 typically has a very deep VB (valence band) energy level. An organic compound having electron transporting property usually has a HOMO energy level shallower than the VB energy level of the inorganic luminescent particle 100. In this case, the holes injected from the first electrode 710 into the EML 740 including the inorganic luminescent particle 100 may be leaked to the second electrode 730 via the ETL 774 including the organic compound.

In one exemplary aspect, the ETL 774 may include an inorganic material having relatively deep VB energy level compared to VB energy level of the inorganic luminescence particle 100 in the EML 740. As an example, an inorganic material having wide energy level bandgap (Eg) between the VB energy level and a conduction band (CB) energy level may be used as an electron transporting material of the ETL 774. In this case, hole injected into the EML 740 including the inorganic luminescent particle 100 is not leaked to the ETL 774 and electrons can be efficiently injected into the EML 740 from the second electrode 730 via the ETL 774.

In one exemplary aspect, the ETL 774 may comprise, but is not limited, an inorganic material such as a metal oxide nanocrystal, a semiconductor nanocrystal, a nitride and/or combination thereof. For Example, the ETL 774 may comprise the metal oxide nanocrystal.

As an example, the metal oxide nanocrystal in the ETL 774 may comprise, but is not limited to, an oxide nano particle of a metal component selected from the group consisting of Zn, Ca, Mg, Ti, Sn, W, Ta, Hf, Al, Zr, Ba and combination thereof. More particularly, the metal oxide in the ETL 774 may comprise, but is not limited to, $TiO_2$, ZnO, ZnMgO, ZnCaO, $ZrO_2$, $SnO_2$, SnMgO, $WO_3$, $Ta_2O_3$, $HfO_3$, $Al_2O_3$, $BaTiO_3$, $BaZrO_3$ and combination thereof. The semiconductor nanocrystal in the ETL 774 may comprise, but is not limited to CdS, ZnSe, ZnS, and the like, the nitride in the ETL 774 may comprise, but is not limited to, $Si_3N_4$.

In one exemplary aspect, the ETL 774 may be designed to have the CB energy level substantially equal to the CB energy level of the EML 740 while the VB energy level deeper than the VB energy level of the EML 740. The ETL 774 may further comprise n-doped component (n-dopant) to the inorganic nano particles. The n-dopant in the ETL 774 may comprise, but is not limited to, metal cation selected from Al, Mg, In, Li, Ga, Cd, Cs, Cu, preferably trivalent cation.

When the ETL 774 comprises an organic compound, the ETL 774 may comprise, but is not limited to, oxadiazole-based compounds, triazole-based compounds, phenanthroline-based compounds, benzoxazole-based compounds, benzothiazole-based compounds, benzimidazole-based compounds, triazine-based compounds, aluminum-based complexes, and the like. More particularly, the organic compound in the ETL 774 may comprise, but is not limited to, 3-(4-Biphenyl)-4-phenyl-5-tert-butylphenyl-1,2,4-triazole (TAZ), 2,9-Dimethyl-4,7-diphenyl-1,10-phenaathroline (BCP), 1,3,5-Tris(N-phenylbenzimidazol-2-yl)benzene (TPBi), tris(8-hydroxyquinoline)aluminum($Alq_3$),bis(2-methyl-8-quninolinato)-4-phenylphenolatealuminum (III) (BAlq), bi s(2-methyl-quinolinato)(tripnehylsiloxy) aluminum (III) (Salq), and combination thereof.

Similar to the CTL1 750, while FIG. 9 illustrates the CTL2 770 as a bi-layered structure including the EIL 772 and the ETL 774, the CTL2 770 may have a mono-layered structure having only the ETL 774. Alternatively, the CTL2 770 may have a mono-layered structure of ETL 774 including a blend of the above-described electron-transporting inorganic material with cesium carbonate.

The CTL2 770, which includes the EIL 772 and/or the ETL 774, may be formed on the EML 740 by any vacuum deposition process such as vacuum vapor deposition and sputtering, or solution process such as spin coating, drop coating, dip coating, spray coating, roll coating, flow coating, casting, screen printing and inkjet printing, or combination thereof. As an example, each of the EIL 772 and the ETL 774 may have a thickness, but is not limited to, between about 10 nm and about 200 nm, alternatively, about 10 nm and 100 nm.

For example, the inorganic LED D may have a hybrid CTL structure in which the HTL 754 of the CTL1 750 includes the organic material as describe above and the CTL2 770, for example, the ETL 774 includes the inorganic material as described above. In this case, The LED D may enhance its luminous properties.

In an alternative aspect, when holes are transferred to the second electrode 730 via the EML 740 and/or electrons are transferred to the first electrode 710 via the EML 740, the inorganic LED D may have short lifetime and reduced luminous efficiency. In order to prevent these phenomena, the inorganic LED D may have at least one exciton blocking layer adjacent to the EML 740.

For example, the inorganic LED D may include the EBL (not shown) between the HTL 754 and the EML 740 so as to control and prevent electron transfers. In one exemplary aspect, the EBL (not shown) may comprise, but is not limited to, TCTA, tris[4-(diethylamino)phenyl]amine), N-(biphenyhl-4-yl)-9,9-dimethyl-N-(4-(9-phenyl-9H-carbazol-3-yl)-9H-fluoren-2-amine, tri-p-tolylamine, 1,1-bis(4-(N,N'-di(ptolyl)amino)phenyl)cyclohexane (TAPC), m-MT-DATA, 1,3-bis(N-carbazolyl)benzene (mCP), 3,3'-bis(N-carbazolyl)-1,1'-biphenyl (mCBP), Poly-TPD, CuPc, DNTPD and/or 1,3,5-tris[4-(diphenylamino)phenyl]benzene (TDAPB).

Also, the inorganic LED D may further include the HBL (not shown) as a second exciton blocking layer between the EML 740 and the ETL 774 so that holes cannot be transferred from the EML 740 to the ETL 774. In one exemplary aspect, the HBL (not shown) may comprise, but is not limited to, oxadiazole-based compounds, triazole-based compounds, phenanthroline-based compounds, benzoxazole-based compounds, benzothiazole-based compounds, benzimidazole-based compounds, and triazine-based compounds and aluminum-based complexes. For example, the HBL (not shown) may comprise a compound having a relatively low HOMO energy level compared to the luminescent materials in EML 740. The HBL (not shown) may comprise, but is not limited to, BCP, BAlq, $Alq_3$, PBD, spiro-PBD, Liq.

[Light Emitting Device]

Figure 10:
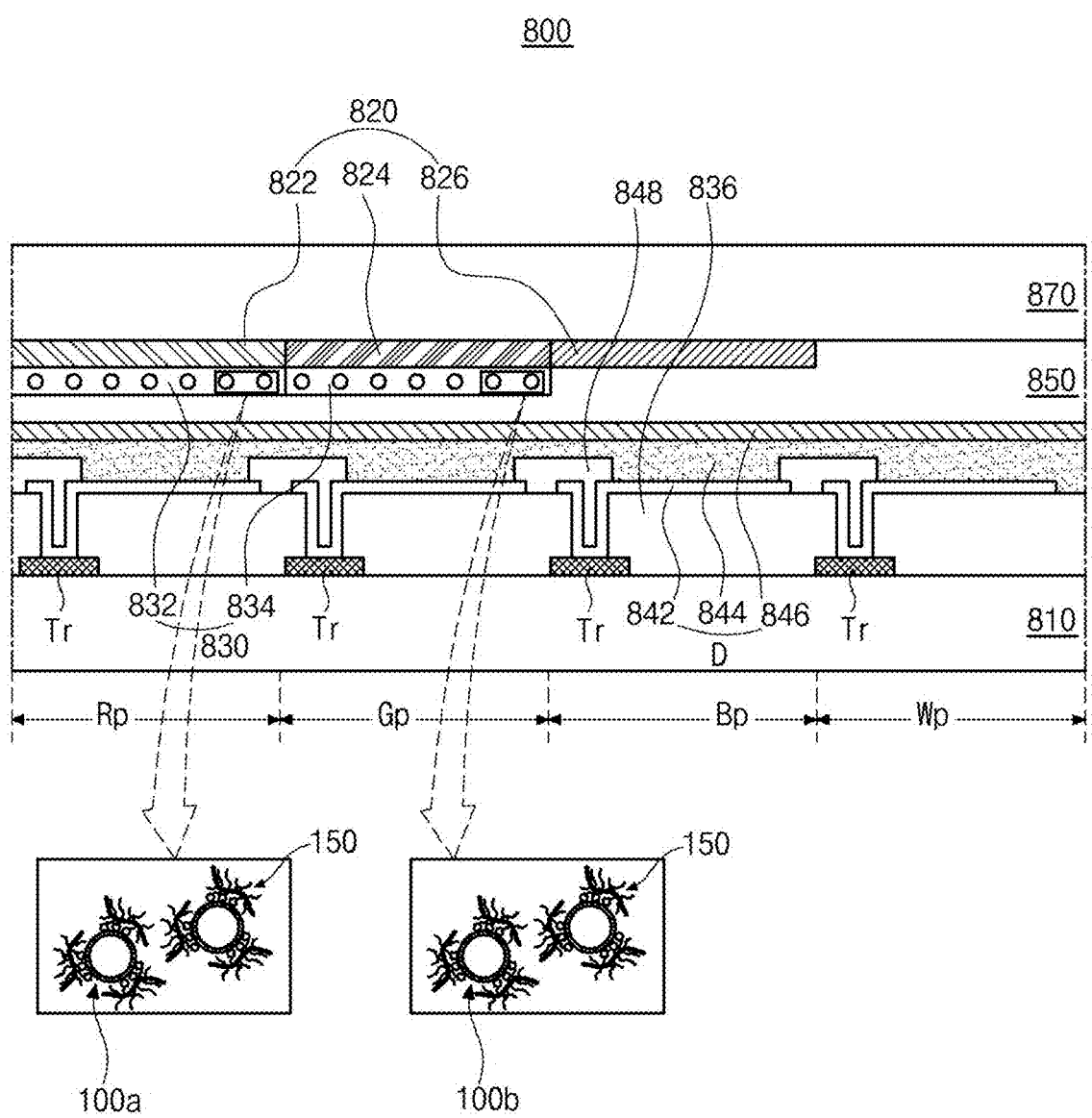
FIG. 10 is a cross-sectional view schematically illustrating a light emitting display device in accordance with an exemplary aspect of the present disclosure where a color conversion layer including inorganic luminescent particles and the dispersants are applied and has a white LED (W-LED).

The polyurethane-based dispersant 150 introducing stable pillar structure 154 (see, FIG. 2) can be adsorbed to the surface of the inorganic luminescent particle 100 so that the particle 100 can improve its dispersion properties, thermal resistance and luminous efficiency, thus the composition including the dispersant 150 adsorbed to inorganic luminescent particle 100 can be applied into a color conversion layer in the light emitting device. FIG. 10 is a cross-sectional view schematically illustrating a light emitting display device in accordance with an exemplary aspect of the present disclosure where a color conversion layer including inorganic luminescent particles and the dispersants are applied and has a white LED (W-LED).

As illustrated in FIG. 10, the light emitting device 800 includes a first substrate 810 a second substrate 870 facing oppositely to the first substrate 810, a light emitting diode (LED) D disposed between the first and second substrates 810 and 870, a color filter layer 820 disposed between the LED D and the second substrate 870, and a color conversion layer 830 disposed between the color filter layer 820 the LED D. A red pixel region Rp, a green pixel region Gp, a blue pixel region Bp and a white pixel region Wp are defined in the first substrate 810, the color filter layer 820 includes color filter patterns 822, 824 and 826 each of which corresponds to each of the red, green and blue pixel regions Rp, Gp and Bp, respectively, and the color conversion layer 830 corresponds to each of the red and green pixel regions Rp and Gp.

The first substrate 810 may be made of transparent material. For example, the first substrate 810 may be a glass substrate, a thin flexible substrate and a polymeric plastic substrate. The second substrate 870 may be made of transparent or obscured materials. For example, the second substrate 870 may be made of glass, plastics such as polyimide and a metal foil.

A polarizing plate (not shown) may be attached onto a display plane of the light emitting display device 800, for example to an external surface of the first substrate 810 in order to prevent the external light from reflecting to the LED D. The polarizing plate (not shown) may be a right-handed circular polarizing plate or a left-handed circular polarizing plate.

An adhesive layer 850 is disposed between the second substrate 870 and the LED D, for example between the color filter layer 820 or the color conversion layer 830 and the LED D, and an encapsulation film (not shown) may be disposed on the LED D and the adhesive layer 850 in order to prevent the external moisture from being infiltrated into the LED D. While not shown in FIG. 10, a gate line and a data line which cross each other and defines the red, green, blue and white pixel regions Rp, Gp, Bp and Wp, and a power line that extends parallel to the gate line or the data line are formed on the first substrate 810.

Also, thin film transistor Tr as the driving element is disposed in each pixel region Rp, Gp, Bp or Wp. The LED D is electrically connected to the thin film transistor Tr of the driving element. The thin film transistor Tr may comprise a semiconductor layer, a gate electrode on the semiconductor layer and source and drain electrodes spaced apart over the gate electrode and connected to the semiconductor layer (see, FIG. 8).

In addition, a switching element connected electrically to the thin film transistor, the gate line and the data line and a storage capacitor connected to the switching element and the power line may be formed in each pixel region Rp, Gp, Bp or Wp on the first substrate 810. As the switching element is turned on by a gate signal applied to the gate line, the data signal applied to the data line is applied to the gate electrode of the thin film transistor as the driving element and an electrode of the storage capacitor through the switching element.

The thin film transistor is turned on by the data signal applied to the gate electrode, and the resulting current proportional to the data signal flows from the power line to the LED D through the thin film transistor as the driving element, and the LED D emit light with luminance proportional to the current though the thin film transistor Tr.

A passivation layer is formed on the thin film transistor Tr. The passivation layer may be formed of inorganic insulating material such as silicon oxide and silicon nitride, or organic insulating material such as photo acryl.

The color filter layer 820 may be disposed on or over the second substrate 870 and includes a red color filter pattern 822, a green color filter pattern 824 and a blue color filter pattern 826 each of which corresponds to the red, green and blue pixel regions Rp, Gp and Bp, respectively. The white (W) light emitted from the LED D in each of the red, green and blue pixel regions Rp, Gp and Bp passes through each of the red, green and blue color filter patterns 822, 824 and 826, respectively, and then each of red, green and blue lights is passed though the second substrate 870 in the respective pixel regions Rp, Gp and Bp, while white light is passed through the second substrate 870 in the white pixel region Wp.

The red color filter pattern 822 (R-CF) comprises a red pigment or a red dye that absorbs the light of blue to green wavelength ranges among the white light and transmits the light of red wavelength ranges. The green color filter pattern 824 (G-CF) comprises a green pigment or a green dye that absorbs the light of blue wavelength ranges and red wavelength ranges among the white light and transmits the light of green wavelength ranges. The blue color filter pattern 826 (B-CF) comprises a blue pigment or a blue dye that absorbs the light of green to red wavelength ranges among the white light and transmits the light of blue wavelength ranges.

When only the color filter layer 820 is disposed between the second substrate 870 and the LED D, only the light of specific wavelength ranges among the white light emitted from the LED D can transmit to the second substrate 870 in each of the red, green and blue pixel regions Rp, Gp and Bp. In other words, only the light of red wavelength ranges can pass through the red pixel region Rp, only the light of green wavelength ranges can pass through the green pixel region Gp and only the light of blue wavelength ranges can pass through the blue pixel region Bp, thus the out-coupling efficiency of the LED D may be deteriorated.

The color conversion layer 830 including the dispersant 150 adsorbed on the surface of the inorganic luminescent particles 100a and 100b is formed on the color filter layer 820. More particularly, the color conversion layer 830 includes a red color conversion layer 832 positioned on the red color filter pattern 822 corresponding to the red pixel region Rp, and a green color conversion layer 834 positioned on the green color filter pattern 824 corresponding to the green pixel region Gp. When the white light is emitted from the LED D, the color conversion layer 830 is formed in the red pixel region Rp and the green pixel region Gp, but is not formed in the blue pixel region Bp and the white pixel region Wp.

The red color conversion layer 832 includes the dispersant 150 adsorbed on the surface of the red inorganic luminescent particle 100a. The red inorganic luminescent particle 100a may be a red quantum dot or a red quantum rod. The red color conversion layer 832 converts the light emitting from the LED D into a red wavelength range, for example, a light having peak wavelength ranges between about 600 nm and about 640 nm.

The green color conversion layer 834 includes the dispersant 150 adsorbed on the surface of the green inorganic luminescent particle 100b. The red inorganic luminescent particle 100b may be a green quantum dot or a green quantum rod. The green color conversion layer 834 converts the light emitting from the LED D into a green wavelength range, for example, a light having peak wavelength ranges between about 500 nm and about 570 nm.

As the white (W) light emitted from the LED D passes through the red color conversion layer 832 positioned correspondingly to the red pixel region Rp, the blue (B) and green (G) light, which has shorter wavelength compared to the red (R) light, among the white light are converted to the red (R) light. Accordingly, as most of the white (W) light emitted from the LED D in the red pixel region Rp passes through the red color filter pattern 822 in a state converted to red wavelength light, the light amount absorbed in the red color filter pattern 822 is reduced, and thereby improving out-coupling efficiency.

In addition, as the white (W) light emitted from the LED D passes through the green color conversion layer 834 positioned correspondingly to the green pixel region Gp, the blue (B) light, which has shorter wavelength compared to the green (G) light, among the white light are converted to the green (G) light. Accordingly, as most of the white (W) light emitted from the LED D in the green pixel region Gp passes through the green color filter pattern 824 in a state converted to green wavelength light, the light amount absorbed in the green color filter pattern 824 is reduced, and thereby improving out-coupling efficiency.

As described above, the color conversion layer 830 is not formed in the blue pixel region Bp. In general, when converting the light wavelength, it is difficult to convert relatively low energy light (long wavelength light) to relatively high energy light (short wavelength light). Since high energy light is emitted in the blue pixel region Bp, it is not easy to convert the white (W) light to blue (B) light through the color conversion layer 830. For this reason, the color conversion layer 830 is not positioned in the blue pixel region Bp. As the white (W) light emitted from the OLED D in the blue pixel region Bp passes through the blue color filter pattern 826, the blue color filter pattern 826 passes through only the blue light with absorbing light in wavelength ranges other than blue wavelength ranges.

In addition, both the color filter pattern 820 and the color conversion layer 8320 are not positioned in the white pixel region Wp, thus the while (W) light emitted from the LED D transmits as it is. In an alternative aspect, the color filter layer 820 may be omitted in case of positioning the color conversion layer 830.

In accordance with one aspect, the color conversion film 830 including the red and green color conversion layers 832 and 834 each of which converts the light emitted from the LED to light of specific wavelength ranges are positioned in the red and green pixel regions Rp and Gp. While the white (W) light emitted from the LED D passes through the color conversion layers 832 and 834 in the specific pixel regions, the white light is converted to a light of specific wavelength ranges capable of transmitting the respective color filter patterns 822 and 824. Accordingly, the light amount absorbed by the red green color filter patterns 822 and 824 can be minimized to improve out-coupling efficiency.

When the color conversion layer includes only the inorganic luminescent particles 100a and 100b, the dispersion density of the particles 100a and 100b dispersed in the binder is much limited. In this case, light leakage of the white light is caused in the color conversion layer containing only the inorganic luminescent particles 100a and 100b, and the luminance of the LED D is lowered as the color filter layer 820 blocks the light leakage. On the other hand, each of the color conversion layers 832 and 834 includes a dispersant 150 stably adsorbed on the surface of the inorganic luminescent particles 100a and 100, thus the luminous efficiency of the particles 100a and 100b is not deteriorated. As the light conversion efficiency in the color conversion layer 830 is improved, light leakage in the color conversion layer 830 is minimized, thus luminance of light emitted from the LED D is not lowered.

In the above aspect, the color conversion layer 830 is divided into the red color conversion layer 832 that is positioned in the red pixel region Rp and comprises the red inorganic luminescent particle 100a, and the green color conversion layer 834 that is positioned in the green pixel region Gp and comprises the green inorganic luminescent particle 100b. Alternatively, the color conversion layer 830 may be positioned over the whole red and green pixel regions Rp and Gp, and may comprise a single color conversion layer comprising the dispersant 150 adsorbed on a surface of red-green inorganic luminescent particles. Also, the color conversion layer may be positioned in the whole red, green and blue pixel regions Rp, Gp and Bp except the white pixel region Wp. In this case, a single color conversion layer may comprise the dispersant 150 adsorbed on the surface of the red inorganic luminescent particle 100a. Further, the light emitted from the LED D is not limited to the white (W) light, but may be blue (B) light.

The LED D comprises a first electrode 842, an emissive layer 844 on the first electrode 842 and a second electrode on the emissive layer 844. The configuration of the LED may be identical to the LED D illustrated in FIG. 9. The emissive layer 844 is disposed on the first electrode 842 and may various light colors including white and blue, and the like. In FIG. 10, the LED D illustrates a single layered emissive layer 844 between the first and second electrodes 842 and 846. Alternatively, the emissive layer 844 in the LED D may comprise an EML, at least one CTL and/or at least one exciton blocking layer, and may have a tandem structure with multiple emitting units. Also, while the emissive layer 844 is formed in the whole display area including the red, green, blue and white pixel regions Rp, Gp, Bp and Wp in FIG. 10, the emissive layer 844 may be positioned separately in each of the pixel regions Rp, Gp, Bp and Wp.

In one exemplary aspect the LED D may be an inorganic LED in which inorganic luminescent particles such as quantum dots and quantum rods are introduced into the EML. Alternatively, the LED D may be an organic LED (OLED) in which organic luminescent material is introduced into the EML. When the LED D is the OLED, the EML comprise the organic luminescent materials. In this case, the organic luminescent materials are not particularly limited. For example, the EML may comprise organic luminescent materials emitting red, green and/or blue lights, and may include phosphorescent materials as well as fluorescent materials including the delayed fluorescent materials. The organic luminescent materials in the EML may comprise a host and a dopant. When the organic luminescent materials includes the host-dopant, the contents of the dopant in the EML may be, but is not limited to, between about 1 wt % and about 50 wt %, preferably about 1 wt % and about 30 wt %.

The organic host in the EML is not particularly limited and may comprise any host. For example, the organic host in the EML may comprise, but is not limited to, Alq$_3$, TCTA, PVK, 4,4'-bis(N-carbazolyl)-1,1'-biphenyl(CBP), 4,4'-Bis (9-carbazolyl)-2,2'-dimethylbiphenyl (CDBP), 9,10-di (naphthalene-2-yl)anthracene (ADN), 3-tert-butyl-9,10-di (naphtha-2-yl)anthracene (TBADN), 2-methyl-9,10-bis (naphthalene-2-yl)anthracene (MADN), TPB, distyrylarylene (DSA), mCP, 1,3,5-tris(carbazol-9-yl)benzene (TCP), and the like.

When the EML emits red light, the red dopant in the EML may comprise, but is not limited to, an organic compound or an organic metal complex such as 5,6,11,12-tetraphenylnaphthalene (Rubrene), Bis(2-benzo[b]-thiophene-2-yl-pyridine) (acetylacetonate)iridium(III) (Ir(btp)$_2$(acac)), Bis [1-(9,9-diemthyl-9H-fluorn-2-yl)-isoquinoline] (acetylacetonate)iridium(III) (Ir(fliq)$_2$(acac)), Bis[2-(9,9-diemthyl-9H-fluorn-2-yl)-quinoline](acetylacetonate) iridium(III) (Ir(flq)$_2$(acac)), Bis-(2-phenylquinoline)(2-(3-methylphenyl) pyridinate)irideium(III) (Ir(phq)$_2$typ), Iridium(III)bis(2-(2,4-difluorophenyl) quinoline)picolinate (FPQIrpic), and the like.

When the EML emits green light, the green dopant in the EML may comprise, but is not limited to, an organic compound or an organic metal complex such as N,N'-dimethyl-quinacridone (DMQA), coumarine, 6,9,10-bis[N, N-di-(p-tolyl)amino]anthracene (TTPA), 9,10-bis[phenyl (m-tolyl)-amino]anthracene (TPA), Bis(2-phenylpyridine) (acetylacetonate)iridium(III) (Ir(ppy)$_2$(acac)), fac-tris (phenylpyridine)iridium(III) (fac-Ir(ppy)$_3$), tris[2-(p-tolyl) pyridine]iridium(III) (Ir(mppy)$_3$), and the like.

When the EML emits blue light, the blue dopant in the EML may comprise, but is not limited to, an organic compound or an organic metal complex such as 4,4'-bis[4-(di-p-tolylamino)styryl]biphenyl (DPAVBi), perylene, 2,5,8, 11-tetra-tert-butylpherylene (TBPe), Bis(3,5-difluoro-2-(2-pyridyl)phenyl-(2-carbozylpyridyl)iridium(III) (FirPic), mer-tris(1-phenyl-3-methylimidazolin-2ylidene-C,C2') iridium(III) (mer-Ir(pmi)$_3$), tris(2-(4,6-difluorophenyl) pyridine)iridium(III) (Ir(Fppy)$_3$), and the like.

When the EML includes the organic luminescent materials, the EML may be formed by any vacuum deposition process such as vacuum vapor deposition and sputtering, or solution process such as spin coating, drop coating, dip coating, spray coating, roll coating, flow coating, casting, screen printing and inkjet printing, or combination thereof. As an example, the EML may have a thickness of, but is not limited to, between about 5 nm and about 300 nm, preferably about 10 nm and about 200 nm.

A bank layer 840 covering the edge of the first electrode 842 may be formed beneath the emissive layer 844. When current is applied to the LED D, the white (W) light is emitted from the LED D, and then the white light passes through the color conversion layer 830 and the color filter layer 820. In this case, the light emitting display device 800 may be a top-emission type. In another exemplary aspect, the light emitting display device may be a bottom-emission type. In this case, the color filter layer may be positioned on or over the first substrate 810 and the color conversion layer may be disposed between the color filter layer and the LED.

Figure 11:
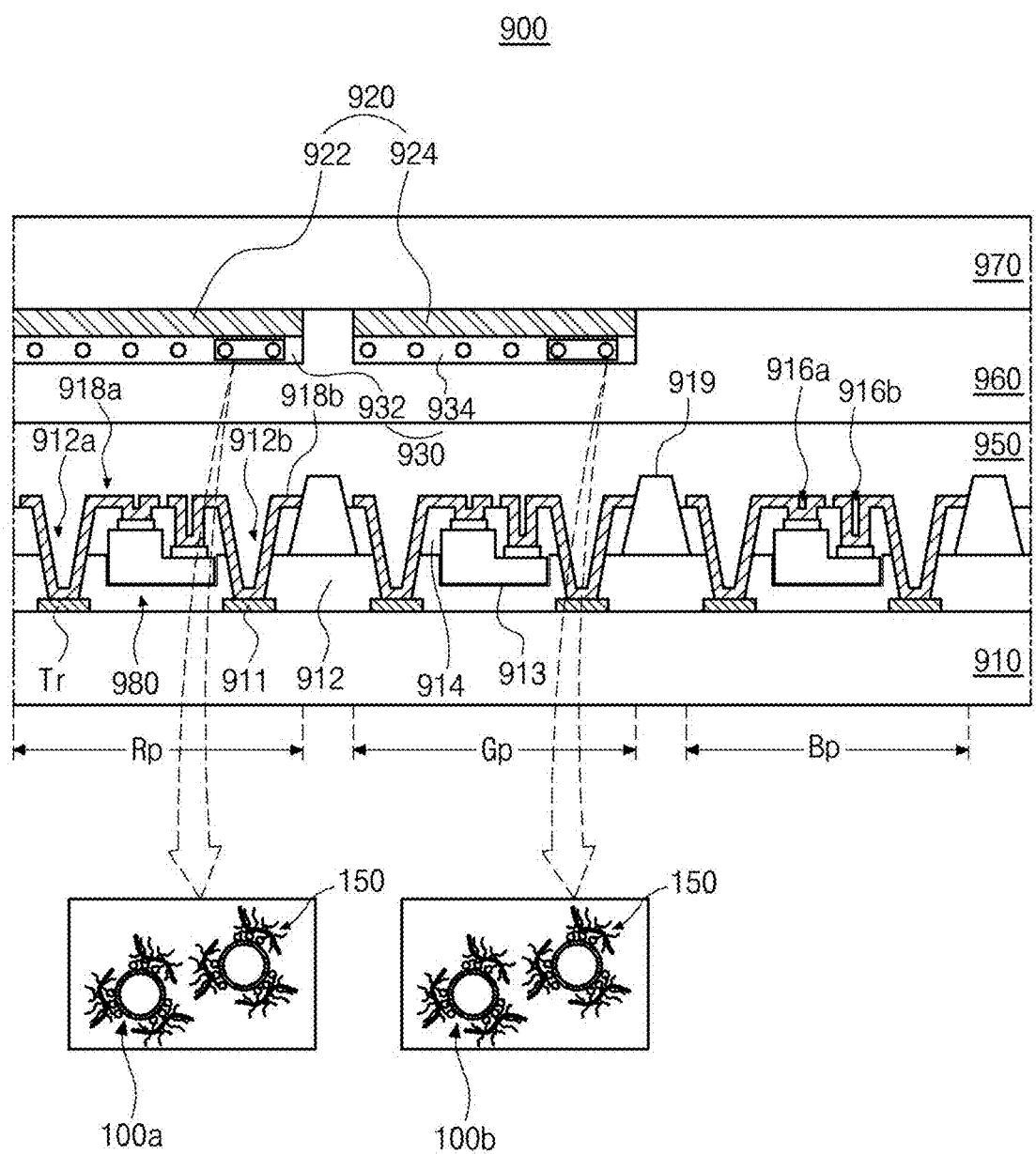
FIG. 11 is a cross-sectional view schematically illustrating a light emitting display device in accordance with an exemplary aspect of the present disclosure where a color conversion layer including inorganic luminescent particles and dispersants and a blue micro LED as a light emitting diode is applied.
Figure 12:
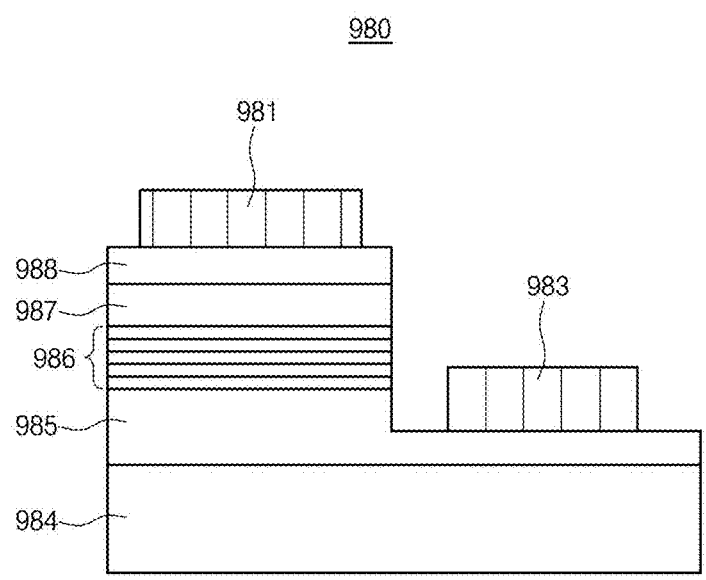
FIG. 12 is a cross-sectional view schematically illustrating of a micro LED in accordance with one exemplary aspect of the present disclosure.

In FIG. 10, the LED D is described as a quantum LED including an inorganic luminescent particles such as quantum dots or quantum rods or as an OLED including the organic luminescent materials. Alternatively, the LED may be a micro light emitting diode (micro LED). FIG. 11 is a cross-sectional view schematically illustrating a light emitting display device in accordance with an exemplary aspect of the present disclosure where a color conversion layer including inorganic luminescent particles and dispersants and a blue micro LED as a light emitting diode is applied. FIG. 12 is a cross-sectional view schematically illustrating of a micro LED in accordance with one exemplary aspect of the present disclosure.

As illustrated in FIG. 11, the light emitting display device 900 comprises a first substrate 910, a second substrate 970 disposed oppositely to the first substrate 910, a micro LED 980 disposed between the first and second substrates 910 and 970, a color filter layer 920 disposed between the micro LED 980 and the second substrate 970 and a color conversion layer 930 disposed between the micro LED 980 and the color filter layer 920. In the first substrate 910, a red pixel region Rp, a green pixel region Gp and a blue pixel region Bp are defined, the color filter layer 920 are positioned corresponding to the red and green pixel regions Rp and Gp and the color conversion layer 930 are positioned corresponding to at least the red and green pixel regions Rp and Gp.

The first substrate 910 may be made of transparent material. For example, the first substrate 910 may be a glass substrate, a thin flexible substrate and a polymeric plastic substrate. The second substrate 970 may be made of transparent or obscured materials. For example, the second substrate 970 may be made of glass, plastics such as polyimide and a metal foil. An encapsulation film is disposed between the second substrate 970 and the micro LED 980 for preventing the external moisture from infiltrating into the micro LED 980, and an adhesive layer 960 may be disposed between the encapsulation film 960 and the second substrate 970.

Thin film transistor Tr as the driving element is disposed in each pixel region Rp, Gp or Bp. The thin film transistor Tr may comprise a semiconductor layer, a gate electrode on the semiconductor layer and source and drain electrodes spaced apart over the gate electrode and connected to the semiconductor layer. In this case, the drain electrode (not shown) may act as a first electrode applying the single into the micro LED 980.

A second electrode 911 made of conductive material is disposed on a gate insulating layer (not shown) in respective pixel region Rp, Gp and Bp. A first insulating layer 912 is formed on the first substrate 910 over which the thin film transistor Tr, and the micro LED 980 is disposed on the first insulating layer 913. For example, the micro LED 980 may be disposed within a concave portion 913 which is formed by removing a portion of the first insulating layer 912. The first insulating layer 912 may be made of inorganic insulating material such as silicon oxide ($SiO_x$) and silicon nitride ($SiN_x$), and/or organic insulating material such as photo acryl.

The micro LED 980 may comprise, but is not limited to, Group III-V nitride semiconductor materials. For example, as illustrated in FIG. 12, the micro LED 980 may comprise an undoped GaN layer 984, n-type GaN layer 985 on the GaN layer 984, an active layer 986 having a Multi-Quantum-Well (MQW) structure on the n-type GaN layer 984, a p-type GaN layer 987 on the active layer 986, an ohmic contact layer 988 made of transparent conductive material on the p-type GaN layer 987, a p-type electrode 981 contacting a portion of the ohmic contact layer 988 and an n-type electrode 983 contacting a portion of the n-type GaN layer 985 exposed by etching a portion of the active layer 946, the p-type GaN layer 987 and the ohmic contact layer 988.

The n-type GaN layer 985 provides electrons to the active layer 986 and may be formed by doping n-type impurities such as silicon to the GaN semiconductor layer. The active layer 986 emits light by recombining injected electrons and holes. While not illustrating in detail, the MQW structure in the active layer 986 has alternately arranged plural barrier layers and well layers where each of the well layers comprises InGaN layer and each of the barrier layers comprises GaN, but the present disclosure is not limited thereto. The p-type GaN layer 987 provides holes to the active layer 986 and may be formed by doping p-type impurities such as Mg, Zn and Mg to the GaN semiconductor layer. The ohmic contact layer 988 is disposed between the p-type GaN layer 987 and the p-type electrode 981 and may be formed of transparent metal oxide such as ITO, IGZO and IZO. Alternatively, each of the p-type electrode 981 and the n-type electrode 983 may have a single layer or multiple layers made of metal selected from Ni, Au, Pt, Ti, Al, Cr, alloy thereof or combination thereof.

When the electrical power is applied into the p-type electrode 981 and the n-type electrode 983 in the micro LED 980, electrons and holes are injected into the active layer 946 from respective the n-type GaN layer 945 and the p-type GaN layer 987, and then light emits externally as excitons are formed and disappeared in the active layer 986. The wavelength of the light emitted from the micro LED 980 may be controlled by adjusting the thicknesses of the barrier layer in the MQW structure. As an example, the micro LED 980 may emit blue light, and may have a thickness of between about 10 um and about 100 um.

While not shown in the drawings, the micro LED 980 may be fabricated by forming a buffer layer on a substrate and growing GaN thin films on the buffer layer. The substrate for growing the GaN thin films may comprise, but is not limited to, sapphire, silicon, GaN, silicon carbide (SiC), gallium arsenide (GaAs) and ZnO. While the micro LED 980 is positioned on the first insulating layer 912 in FIG. 12, the micro LED is not limited to such specific structured micro LED and various micro LEDs such as a vertical structured micro Led and a horizontal structured micro LED may be applied into the present disclosure.

Referring back to FIG. 11, a second insulating layer 914 is disposes on the first insulating layer 912 over which the micro LED 980 is transferred. The second insulating layer 914 is made of inorganic insulating material such as silicon oxide ($SiO_x$) and silicon nitride ($SiN_x$), and/or organic insulating material such as photo acryl.

A first contact hole 912a and a second contact hole 912 are formed on each of the first and second insulating layers 912 and 914 over the thin film transistor Tr and the second electrode 911 and exposes the drain electrode (not shown) of the thin film transistor Tr and the second electrode 911. Also, a third contact hole 916a and a fourth contact hole 916b are formed on the second insulating layer 914 over each of the p-type electrode 981 and the n-type electrode 983 of the micro LED 980, and thereby the p-type electrode 981 and the n-type electrode 983 are exposed externally.

A first connection electrode 918a and a second connection electrode 918b made of transparent metal oxide such as ITO, IGZO and/or IZO are formed on the second insulating layer 914. The drain electrode (not shown) and the p-type electrode 981 of the micro LED 980 are electrically interconnected through the first and third contact holes 912a and 816a, and the second electrode 911 and the n-type electrode 983 of the micro LED 980 are electrically interconnected through the second and third contact holes 912b and 916b.

Also, a reflective insulating film 919 is formed over the first substrate 910 including the connection electrodes 918a and 918b. The reflective insulating film 919 is disposed to encapsulate the outer periphery of each micro LED 980. The reflective insulating film 919 reflects a light laterally emitted from the micro LED 980 among the light emitted from the respective micro LED 980 to an upper plane of the first substrate 910 in order to improve the out-coupling efficiency of the micro LED 980. The reflective insulating film 919 can be made of insulating material including fine particles for light reflection, for example, may be made of, but is not limited to, an insulating material of silicon oxide ($SiO_x$) or silicon nitride ($SiN_x$) in which titanium oxide ($TiO_2$) particles are dispersed.

The color filter layer 920 may be disposed on or over the second substrate 970 and includes a red color filter pattern (R-CF) 922 and a green color filter pattern (G-CF) 924 each of which corresponds to the red, and green pixel regions Rp and Gp, respectively. In the blue pixel region Bp, the color filter pattern 920 is not positioned. The blue (B) light emitted from the micro LED 980 in each of the red and green pixel regions Rp and Gp passes through each of the red and green color filter patterns 922 and 924, respectively, and then each of red and green lights is passed through the second substrate 970 in the respective pixel regions Rp and Gp, while the blue light is passes through the second substrate 970 in the blue pixel region Bp.

When only the color filter layer 920 is disposed between the second substrate 970 and the micro LED 980, only the light of specific wavelength ranges among the blue (B) light emitted from the micro LED 980 can transmit to the second substrate 970 in each of the red and green pixel regions Rp and Gp. In other words, only the light of red wavelength ranges can pass through the red pixel region Rp and only the light of green wavelength ranges can pass through the green pixel region Gp, thus the out-coupling efficiency of the micro LED 980 may be deteriorated.

The color conversion layer 930 including the dispersant 150 adsorbed on the surface of the inorganic luminescent particles 100a and 100b is positioned on the color filter layer 920. More particularly, the color conversion layer 930 includes a red color conversion layer 932 positioned on the red color filter pattern 822 corresponding to the red pixel region Rp, and a green color conversion layer 934 positioned on the green color filter pattern 924 corresponding to the green pixel region Gp. But, the color conversion layer 930 is not positioned in the blue pixel region Bp.

The red color conversion layer 932 includes the dispersant 150 adsorbed on the surface of the red inorganic luminescent particle 100a. The blue (B) light emitted from the micro LED 980 in the red pixel region Rp passes through the red color conversion layer 932 and is converted into the red (R) light, and then the converted red (R) light passes through the red color filter pattern 932 to emit an intended red (R) light. Some blue (B) light that is not converted in passing through the red color conversion layer 932 may be absorbed in the red color filter pattern 922. Since most of the blue (B) light emitted from the micro LED D 980 in the red pixel region Rp passes through the red color filter pattern 922 in a state converted to red wavelength light, the light amount absorbed in the red color filter pattern 922 is reduced, and thereby improving out-coupling efficiency.

The green color conversion layer 934 includes the dispersant 150 adsorbed on the surface of the green inorganic luminescent particle 100b. The blue (B) light emitted from the micro LED 980 in the green pixel region Gp passes through the green color conversion layer 934 and is converted into the green (G) light, and then the converted green (G) light passes through the green color filter pattern 934 to emit an intended green (R) light. Some blue (B) light that is not converted in passing through the green color conversion layer 934 may be absorbed in the green color filter pattern 924. Since most of the blue (B) light emitted from the micro LED 980 in the green pixel region Gp passes through the green color filter pattern 924 in a state converted to green wavelength light, the light amount absorbed in the green color filter pattern 924 is reduced, and thereby improving out-coupling efficiency.

The blue (B) light emitted from the micro LED 980 in the blue pixel region Bp transmits as it is, and therefore, both the color filter pattern 920 and the color conversion layer 930 are not positioned in the blue pixel region Bp.

Since each of the color conversion layers 932 and 934 includes the dispersant 150 adsorbed stably on the surface of the inorganic luminescent particles 100a and 100b, the inorganic luminescent particles 100a and 100b can maintain their luminous properties. As the light conversion efficiency in the color conversion layer 930 is improved, light leakage in the color conversion layer 930 is minimized, thus luminance of light emitted from the micro LED 980 is not lowered. When the color conversion layer 930 is disposed, the color filter layer 920 may be omitted.

In an alternative aspect, the color conversion layer 930 may be positioned over the whole red and green pixel regions Rp and Gp, and may comprise a single color conversion layer comprising the dispersant 150 adsorbed on a surface of red-green inorganic luminescent particles. Also, the color conversion layer may be positioned in the whole red and green pixel regions Rp and Gp except the blue pixel region Bp. In this case, a single color conversion layer may comprise the dispersant 150 adsorbed on the surface of the red inorganic luminescent particle 100a.

In another exemplary aspect, the light emitting display device 900 may be a bottom-type. In this case, the color filter layer may be positioned on or over the first substrate 910 and the color conversion layer may be positioned between the color filter layer and the micro LED.

Synthesis Example 1: Synthesis of Polyurethane-Based Dispersant Having Pillar Structure A polyurethane-based dispersant having the pillar structure on a side chain was synthesized as follows: Polyethylene glycol monomethyl ether (PEG monomethyl ether, $M_W$=200 g/mol, 400 mg, 2.00 mmol) as an alcohol precursor and an aliphatic diol, 1,1-hexadecanediol (2.65 mmol) were dissolved in anhydrous tetrahydrofuran (THF, 10 mL). 1,6-hexamethylene diisocyanate (HDI, 614 mg, 3.65 mmol) anc 1,4-diazabicyclo octane (DABCO, 12.1 mg, 0.061 mmol) and triethyl amine as a catalyst were added into the reactants, and the materials were reacted at 75° C. for 7 hours under nitrogen atmosphere until the solution becomes transparently viscous, that is urethane polymerization reaction initiates with stirring. After the mixture was cooled down to a room temperature, excessive amount of diethyl ether was added to precipitate the polyurethane having the pillar structure.

Synthesis Examples 2-4: Synthesis of Polyurethane-Based Dispersant Having Pillar Structure Polyurethane-based dispersants were synthesized in the same manner as Synthesis Example 1, except using 1,1-heptane diol (Synthesis Example 2), 1,1-decane diol (Synthesis Example 3) or 1,1-octadecane diol (Synthesis Example 4) as the aliphatic diol instead of 1,1-hexadecane diol.

Comparative Synthesis Examples 1-4 (Ref 1-4): Synthesis of Polyurethane-Based Dispersant Using 1,2-Alkane Diol Polyurethane-based dispersants were synthesized in the same manner as Synthesis Example 1, except using 1,2-hexadecane diol (Comparative Synthesis Example 1), 1,2-heptane diol (Comparative Synthesis Example 2), 1,2-decane diol (Comparative Synthesis Example 3) or 1,2-octadecane diol (Comparative Synthesis Example 4), which has not 1,1-diol structure, as the aliphatic diol instead of 1,1-hexadecane diol.

Comparative Synthesis Examples 5-8 (Ref 5-8): Synthesis of Polyurethane-Based Dispersant Using 1,3-Alkane Diol Polyurethane-based dispersants were synthesized in the same manner as Synthesis Example 1, except using 1,3-hexadecane diol (Comparative Synthesis Example 5), 1,3-heptane diol (Comparative Synthesis Example 6), 1,3-decane diol (Comparative Synthesis Example 7) or 1,3-octadecane diol (Comparative Synthesis Example 8), which has not 1,1-diol structure, as the aliphatic diol instead of 1,1-hexadecane diol.

Comparative Synthesis Examples 9-12 (Ref. 9-12): Synthesis of Polyurethane-Based Dispersant Using 1,ω-Alkane Diol Polyurethane-based dispersants were synthesized in the same manner as Synthesis Example 1, except using 1,ω-hexadecane diol (Comparative Synthesis Example 9), 1,ω-heptane diol (Comparative Synthesis Example 10, 1,ω-decane diol (Comparative Synthesis Example 11) or 1,ω-octadecane diol (Comparative Synthesis Example 12), which has not 1,1-diol structure, as the aliphatic diol instead of 1,1-hexadecane diol.

EXAMPLE 1

Evaluation Dispersion Property in Polar Solvents

Figure 13:
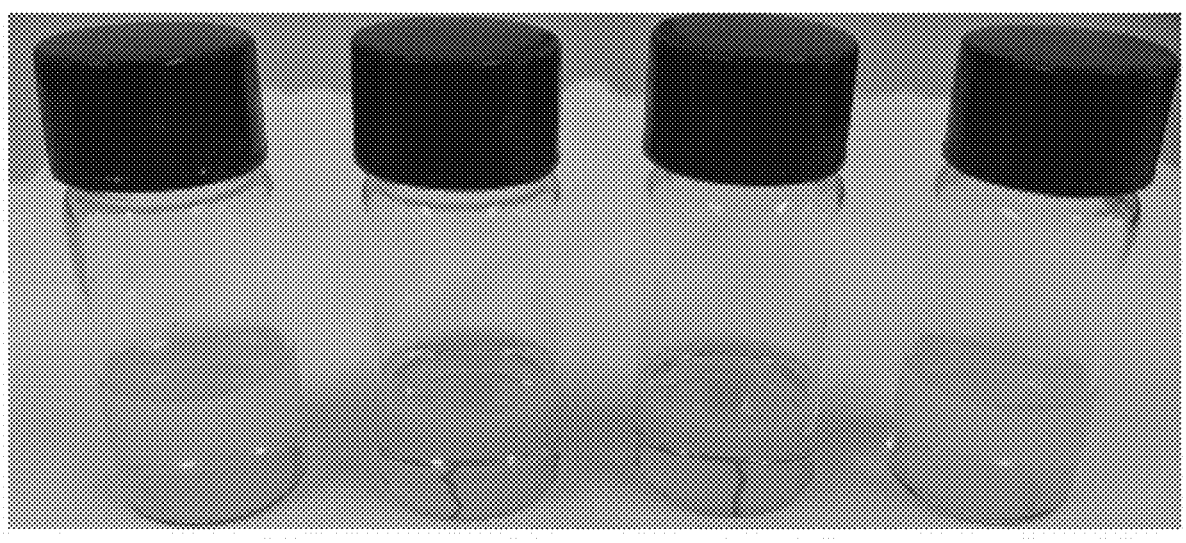
FIG. 13 is an image illustrating dispersant property of the dispersant synthesized in accordance with Examples.

The polyurethane-based dispersants using 1,2-alkane diols in Synthesis Examples 1-4 and the polyurethane-based dispersants using diols in Ref 1-12 were added into a polar solvent, propylene glycol monomethyl ether acetate (PGMEA) and then evaluated their dispersion properties in the polar solvent. Table 1 below indicates the results of dispersion properties for the dispersants and FIG. 13 illustrates dispersion degrees of the dispersants in Synthesis Examples 1-4 in the polar solvent. As indicated in Table 1, compared to the dispersants in Ref. 1-12, the dispersants in Synthesis Examples have improved dispersion properties in the polar solvent, PGMEA.

TABLE 1

| | Evaluation of Dispersion Property | | | |
|---|---|---|---|---|
| Sample | heptanes diol | decane diol | hexadecane diol | octadecane diol |
| 1,1-diol | Δ | ○ | ○○ | Δ |
| 1,2-diol | X | Δ | Δ | X |
| 1,3-diol | Δ | X | X | X |
| 1,ω-diol | Δ | Δ | Δ | C |
| No pillar | | | Δ | |

Evaluate the dispersion property compared to the convention dispersant without any pillar structure based on turbidity tests.

EXAMPLE 2

Measurement of QY of QD Dispersed in Dispersants

Figure 14:
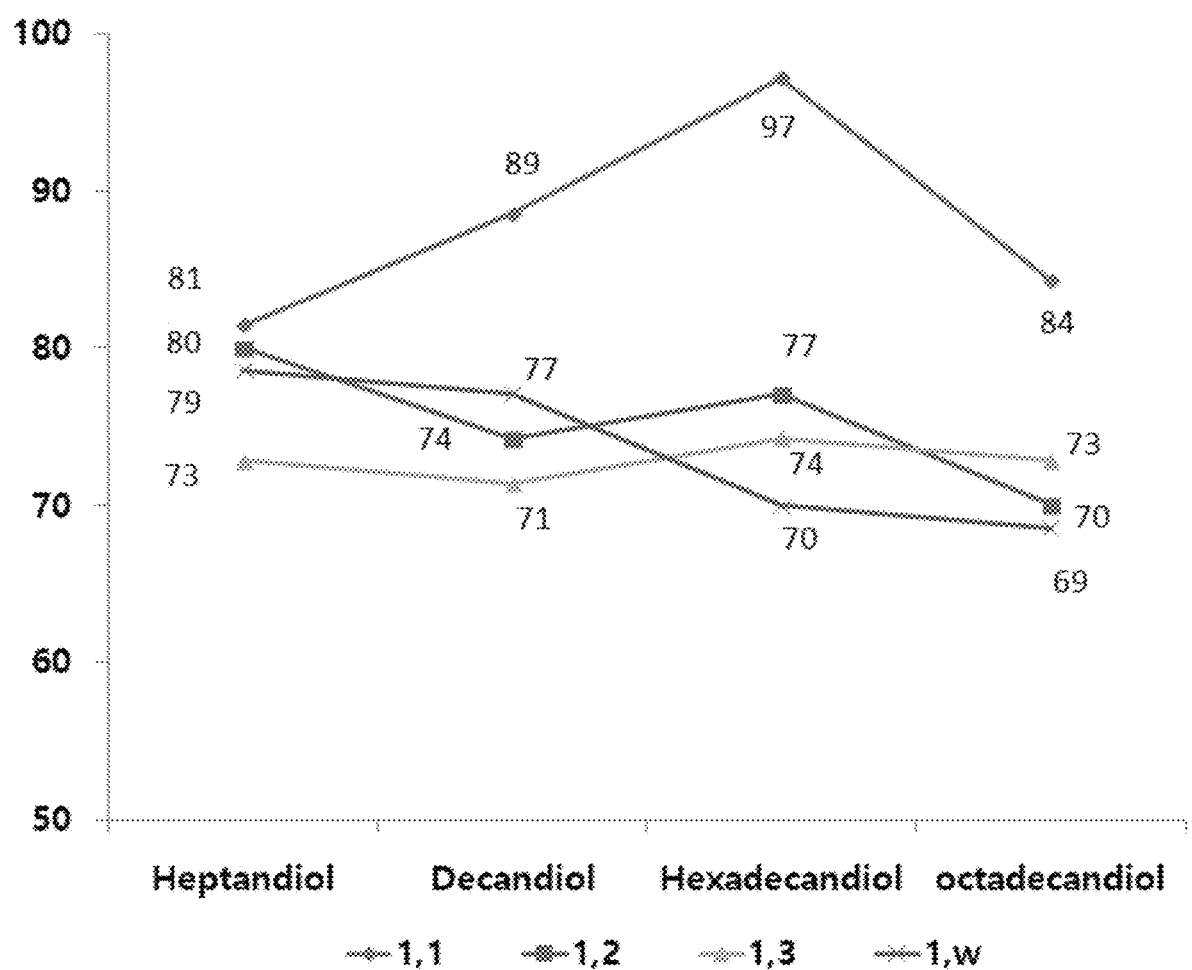
FIG. 14 is a graph illustrating a result of measuring Quantum Yield of quantum dots dispersed in the dispersant synthesized in accordance with Examples.

A quantum yield (QY) of a green quantum dot (InP/ZnSe, linked by organic ligand of aliphatic acid amino, photoluminescence peak: 530-535 nm) prior to dispersing the dispersants (initial QY) was measured, and then the QY of the quantum dots dispersed in each of the polyurethane-based dispersants of Synthesis Examples 1-4, the polyurethane-based dispersants of Ref. 1-12 and the convention dispersant without any pillar structure, and the QY of the quantum dots dispersed in each of the dispersants were measured to evaluate the QY differences compared to the QY of the initial quantum dot (prior to dispersing). Table 2 and FIG. 14 illustrate the measurement results. The quantum dots dispersed in the polyurethane-based dispersants into which the pillar structure was applied by using 1,1-alkane diols in Synthesis Examples 1-4 maintained relatively high QY. Particularly, the quantum dot dispersed in the polyurethane-based dispersant having the pillar structure derived from 1,1-hexadecane diol in Synthesis Example 1 maintained its QY substantially identical as the initial quantum dot.

TABLE 2

| Quantum Yield of Quantum Dots | | | | |
|---|---|---|---|---|
| | Quantum Yield (Compared to Initial value) | | | |
| Sample | heptanes diol | decane diol | hexadecane diol | octadecane diol |
| 1,1-diol | 57(81%) | 62(89%) | 68(97%) | 59(84%) |
| 1,2-diol | 56(80%) | 52(74%) | 54(77%) | 49(70%) |
| 1,3-diol | 51(73%) | 50(71%) | 52(74%) | 51(73%) |
| 1,ω-diol | 55(79%) | 54(77%) | 49(70%) | 58(69%) |
| no pillar | 55 (78%) | | | |
| Initial QD | 70 | | | |

EXAMPLE 3

Evaluation Thermal Resistance of QD Film

Figure 15:
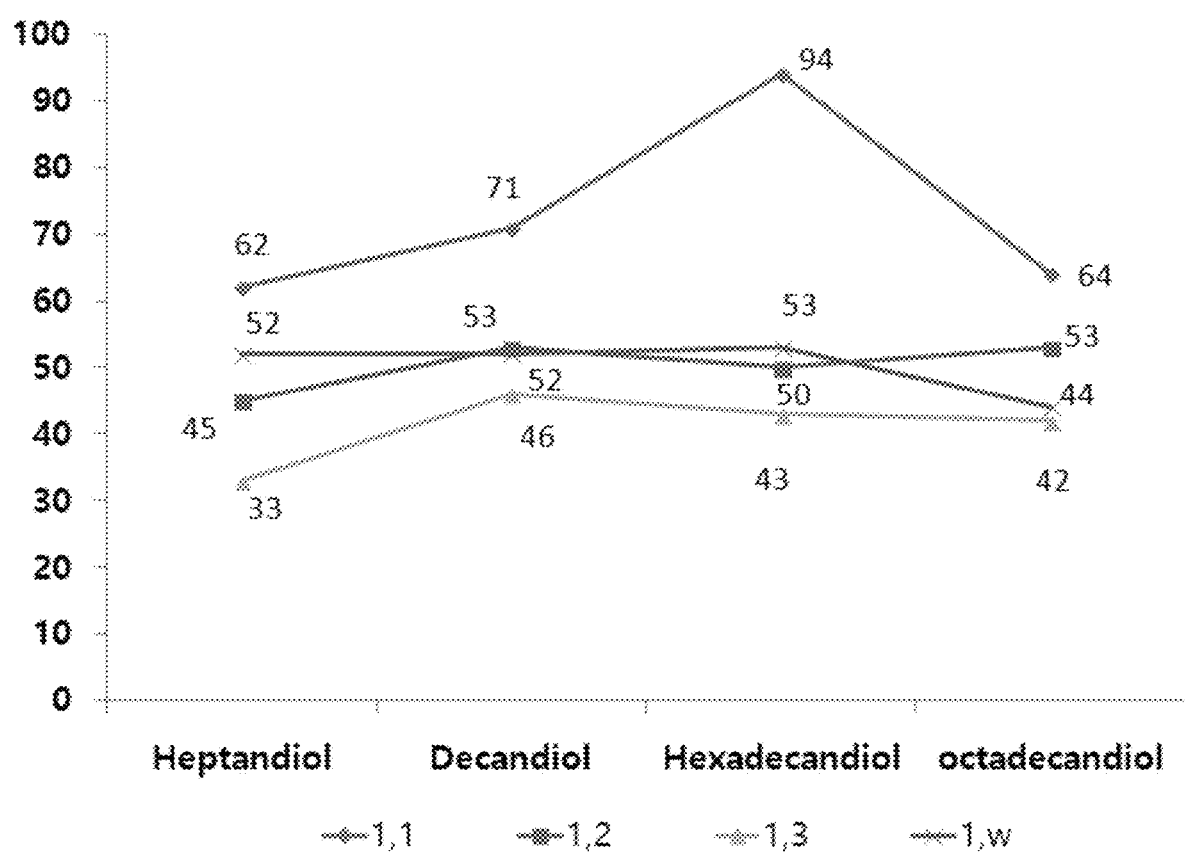
FIG. 15 is a graph illustrating a result of measuring External Quantum Efficiency of quantum dots dispersed in the dispersant synthesized in accordance with Examples in order to evaluate thermal resistances of the quantum dots.

Mixtures of each of the polyurethane-based dispersant in Synthesis Examples 1-4, the polyurethane-based dispersant in Ref. 1-12 and the conventional dispersant, a quantum dot (InP/ZnSe, linked by organic ligand of aliphatic acid amino, photoluminescence peak: 530-535 nm) and an organic solvent was applied into a bare glass using a spin-coating, performed a soft baking at 80° C. for 5 minutes and then initial EQE (external quantum efficiency) for each film was measured. In order to evaluate the thermal resistance, a hard baking was performed for each film in an oven at 180° C. for 6 hours in air. EQE for each of the hard-baked film was measured again and compared to the initial EQE. Table 3 and FIG. 15 illustrate the results. The quantum dots dispersed in the polyurethane-based dispersants into which the pillar structure was applied by using 1,1-alkane diols in Synthesis Examples 1-4 maintained relatively high EQE. Particularly, the quantum dot dispersed in the polyurethane-based dispersant having the pillar structure derived from 1,1-hexadecane diol in Synthesis Example 1 maintained its EQE substantially identical as the initial quantum dot. These results indicate that the dispersant in Synthesis Examples 1-4 enables the quantum dot to improve their thermal property.

TABLE 3

EQE Changes of Quantum Dot

| Sample | EQE (%, Compared to Initial value) | | | |
|---|---|---|---|---|
| | heptanes diol | decane diol | hexadecane diol | octadecane diol |
| 1,1-diol | 20→13(62%) | 24→17(71%) | 25→23(94%) | 22→14(64%) |
| 1,2-diol | 20→9(45%) | 19→10(53%) | 20→10(50%) | 19→10(53%) |
| 1,3-diol | 18→6(33%) | 20→9(45%) | 21→9(43%) | 19→8(42%) |
| 1,ω-diol | 21→11(52%) | 21→11(52%) | 19→10(53%) | 18→8(44%) |
| no pillar | 18→10 (55%) | | | |

It will be apparent to those skilled in the art that various modifications and variations can be made in the dispersant, the light emitting film, the light emitting diode and light emitting device including the dispersant of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting device comprising:
   a substrate;
   a light emitting diode over the substrate; and
   a color conversion layer disposed between the substrate and the light emitting diode or over the light emitting diode, the color conversion layer converting a light emitted from the light emitting diode to other colors,
   wherein the color conversion layer comprises an inorganic luminescent particle and a dispersant adsorbed on a surface of the inorganic luminescent particle, wherein the dispersant has a structure represented by Chemical Formula 1:

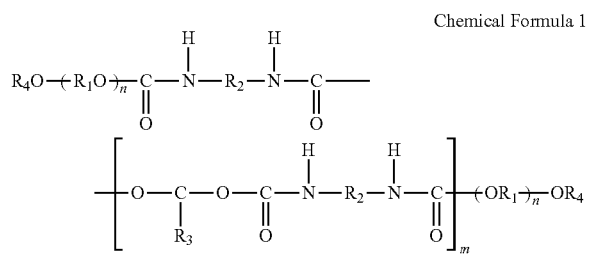

Chemical Formula 1 wherein:
$R_1$ is an unsubstituted or substituted $C_2$-$C_{20}$ alkylene group, an unsubstituted or substituted $C_2$-$C_{20}$ alkyl vinylene group, an unsubstituted or substituted $C_6$-$C_{30}$ arylene group or an unsubstituted or substituted $C_3$-$C_{30}$ hetero arylene group;
$R_2$ is an unsubstituted or substituted $C_1$-$C_{20}$ alkylene group, an unsubstituted or substituted $C_5$-$C_{20}$ cyclo alkylene group, a substituted or substituted $C_6$-$C_{20}$ arylene group, a $C_{10}$-$C_{30}$ bicyclo alkylene group or a $C_{12}$-$C_{30}$ biarylene group, where each of the $C_{10}$-$C_{30}$ bicyclo alkylene group and the $C_{12}$-$C_{30}$ biarylene group is linked to a $C_1$-$C_5$ alkylene group;
$R_3$ is a $C_5$-$C_{20}$ aliphatic hydrocarbon;
$R_4$ is protium, deuterium or a $C_1$-$C_{10}$ alkyl group; and
each of m and n is independently an integer of 1 to 100.

2. The light emitting device of claim 1, wherein the substrate defines a red pixel region, the color conversion film comprises a red color conversion film disposed correspondingly to the red pixel region, and the inorganic luminescent particle in the red color conversion film comprise a red quantum dot or a red quantum rod which converts the light emitted from the light emitting diode to a red light.

3. The light emitting device of claim 2, the substrate further defines a green pixel region, the color conversion film further comprises a green color conversion film disposed correspondingly to the green pixel region, and the inorganic luminescent particle in the green color conversion film comprise a green quantum dot or a green quantum rod which converts the light emitted from the light emitting diode to a green light.

4. The light emitting diode of claim 1, wherein the substrate defines a red pixel region and a green pixel region and the inorganic luminescent particle is disposed at least one of the red pixel region and the green pixel region, and wherein the inorganic luminescent particle emits a red, green or red-green light.

5. The light emitting device of claim 1, further comprises a color filter layer disposed over the color conversion film or between the substrate and the color conversion film.

6. The light emitting device of claim 1, wherein the light emitting diode comprises a first electrode, a second electrode facing the first electrode and an emitting material layer disposed between the first and second electrodes.

7. The light emitting device of claim 6, wherein the emitting material layer comprises an inorganic luminescent particle.

8. The light emitting device of claim 7, wherein the inorganic luminescent particle in the emitting material layer comprises a quantum dot (QD) or a quantum rod (QR).

9. The light emitting device of claim 6, wherein the emitting material layer comprises an organic luminescent material.

10. The light emitting device of claim 1, wherein the light emitting diode comprise a micro light emitting diode.

11. The light emitting device of claim 10, wherein the micro light emitting diode emits blue light.

12. The light emitting device of claim 1, wherein:
$R_1$ is an unsubstituted or substituted $C_2$-$C_5$ alkylene group,
$R_2$ is an unsubstituted or substituted $C_2$-$C_{10}$ alkylene group, and
$R_3$ is a linear or branched $C_7$-$C_{18}$ alkyl group.

13. The light emitting device of claim 1, wherein the dispersant has a weight average molecular weight (Mw) between about 2,000 and about 50,000.

* * * * *